US008816671B2

(12) United States Patent
Jacoby, Jr. et al.

(10) Patent No.: US 8,816,671 B2
(45) Date of Patent: Aug. 26, 2014

(54) ELECTRONIC PROBE HOUSING AND AUTOMATIC SHUTOFF FOR STEAM TURBINE

(76) Inventors: James Leon Jacoby, Jr., Sugarland, TX (US); Timothy A. Pieszchala, Seabrook, TX (US)

( * ) Notice: Subject to any disclaimer, the term of this patent is extended or adjusted under 35 U.S.C. 154(b) by 616 days.

(21) Appl. No.: 12/932,795

(22) Filed: Mar. 7, 2011

(65) Prior Publication Data

US 2011/0277478 A1 Nov. 17, 2011

Related U.S. Application Data

(63) Continuation-in-part of application No. 12/800,213, filed on May 11, 2010.

(51) Int. Cl.
*G01R 33/28* (2006.01)

(52) U.S. Cl.
USPC .......................................................... 324/73.1

(58) Field of Classification Search
USPC .......................................................... 324/73.1
See application file for complete search history.

(56) References Cited

U.S. PATENT DOCUMENTS 3,931,714 A * 1/1976 Jaegtnes et al. ................. 60/660

* cited by examiner

*Primary Examiner* — Reena Aurora
(74) *Attorney, Agent, or Firm* — William E. Johnson, Jr.

(57) ABSTRACT

An electronic probe housing having two speed pick up devices automatically sends electric signals to an electronic governor which causes the RPM of the steam turbine to increase, decrease or remain constant, in conjunction with one or more additional speed pick up devices in the same probe housing which uses a logical array of electro-hydraulic solenoid valves to control an automatic shut off system which cuts off the steam supply to the steam turbine.

5 Claims, 37 Drawing Sheets

TURBINE RUNNING

TURBINE TRIPPED

TURBINE TRIPPED

TURBINE RUNNING

TURBINE TRIPPED

TURBINE RUNNING

TURBINE RUNNING

TURBINE RUNNING

TURBINE RUNNING

ELECTRONIC PROBE HOUSING AND AUTOMATIC SHUTOFF FOR STEAM TURBINE

RELATED APPLICATION

This application is a Continuation-In-Part of U.S. patent application Ser. No. 12/800,213, filed May 11, 2010, for Electronic Probe Housing for Steam Turbine.

BACKGROUND OF THE INVENTION

Steam turbines have been well known in the art for many years, with the modern steam turbine having apparently been invented by the Englishman Sir Charles Parsons in 1884, an invention which was later scaled-up by the American George Westinghouse. The classic steam turbine, in perhaps its most simplistic form, is illustrated as prior art in FIG. 1A, showing the entry of steam to cause the turbine blades to spin, which in turn causes a generator to spin, thus spinning the generator to produce electricity. The steam enters the apparatus of FIG. 1A through one or more valves, it being known that the rotational speed of the turbine is controlled by the varying of the number of valves, and/or by positioning of such valves and/or by changing the volumetric opening through such one or more such valves.

It is also well-known in this art to use a governor with the valve system discussed above to control the rotational speed of the turbine by controlling the steam flow.

It is also known in this art to use microprocessor based control systems marketed by the Woodward Governor Company, located at 1000 East Drake Road, Fort Collins, Colo. 80525, designed to function with speed monitors available from other sources.

Moreover, it is known in the prior art to measure the rotational speed, i.e., the timed number of revolutions of the turbine shaft, to control the hydraulic actuators involved with the controlled movement of the valves and thus control of the steam turbine. These types of known systems are described in detail in U.S. Pat. No. 4,461,152 to Yashuhiro Tennichi and Naganobu Honda, and in U.S. Pat. No. 4,658,590 to Toshihiko Higashi and Yasuhiro Tennicho.

DETAILED DESCRIPTION OF PREFERRED EMBODIMENT OF INVENTION

Figure 1A:
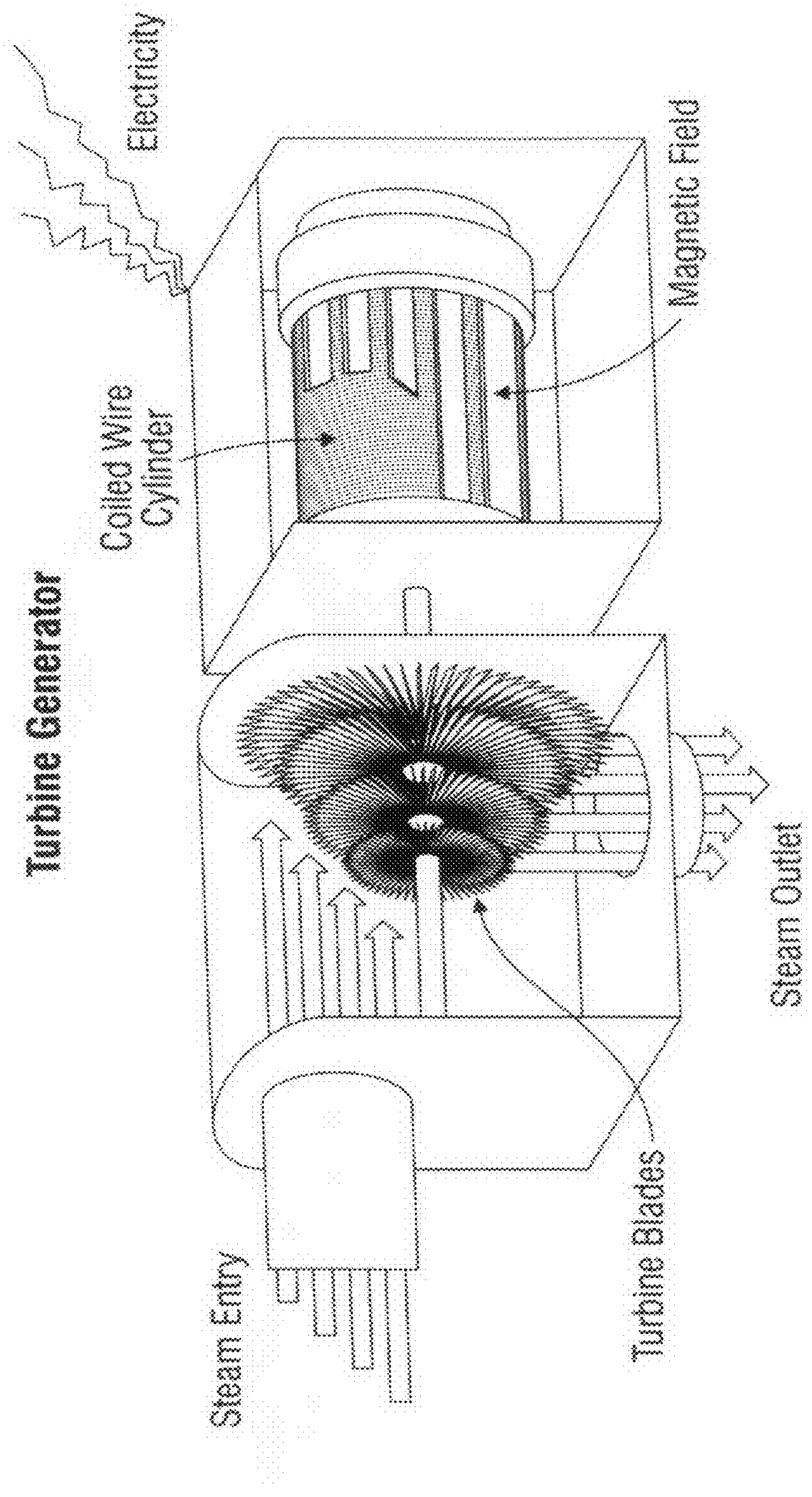
FIG. 1A (Prior Art)
FIG. 1A is a pictorial, simplistic view of a steam turbine well known in the prior art.

FIG. 1A illustrates a typical steam turbine generator, well-known in the prior art, in which steam enters the turbine to thus cause the turbine blades, mounted on a rotatable shaft, to spin a generator to produce electricity. Such steam turbines are also used to drive other rotatable equipment such as, compressors, pumps and the like. Such prior art steam turbines typically use positionable valves (not illustrated in FIG. 1A) to control the steam impacting the turbine blades to thus control the speed of rotation of the shaft.

It is known in the prior art to measure the pressure of the steam as the steam exits the enclosure around the turbine blades, since such steam pressure differential, up or down, is an indication of the changes in the speed of rotation of the drive shaft. For example, if the steam pressure from the exit port decreases, the one or more steam valves can be manipulated manually to thereby increase the speed of shaft rotation up to a desired level.

It is also known in this art to locate an electronic sensor on or near the drive shaft, with a visual sensor, and when the sensor provides a visual indication of speed change to a technician or engineer, such technician or engineer can then manually adjust the steam valve or valves to thereby adjust the speed of rotation of the drive shaft.

Figure 1B:
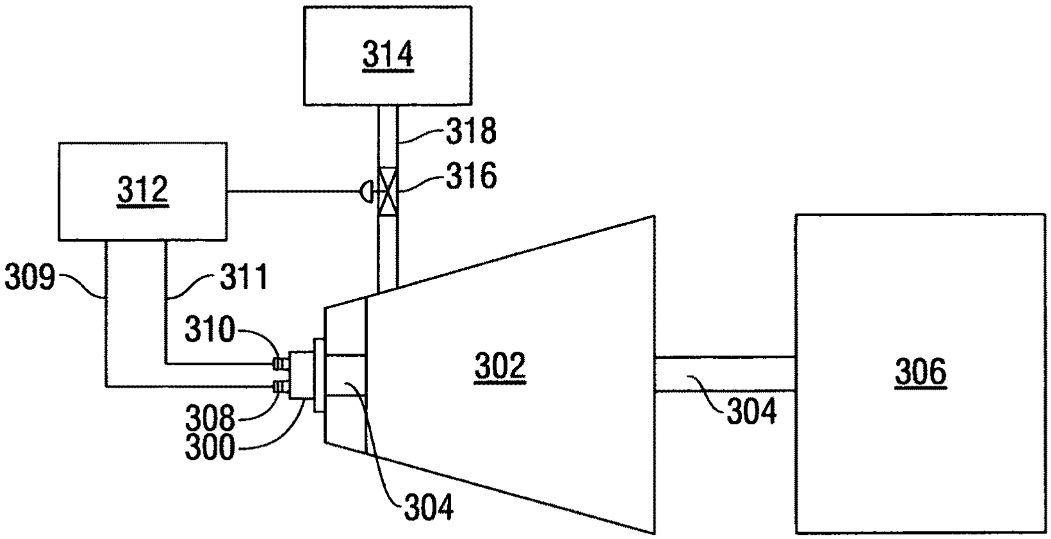
FIGS. 1B and 1C are block diagrams of a steam turbine system using an electronic probe housing in combination with a governor, a steam governoring valve, a steam turbine and a rotatable load according to the invention.

FIG. 1B illustrates in block diagram the electronic probe housing 300 according to the present invention in use with a steam turbine 302 having a rotatable drive shaft 304 between the housing 300 and the turbine 302, and between the turbine 302 and the load 306, which may be any rotatable equipment, such as a generator, a pump, a compressor or the like.

FIG. 1B also illustrates a pair of magnetic pickup sensors 308 and 310 coming out of the probe housing 300, and having electrical lines 309 and 311 leading into the electronic governor 312. A source of pressurized steam 314 is connected through one or more valves 316 in steam pipe 318 into the steam turbine 302 to drive the turbine blades therein.

Figure 1C:
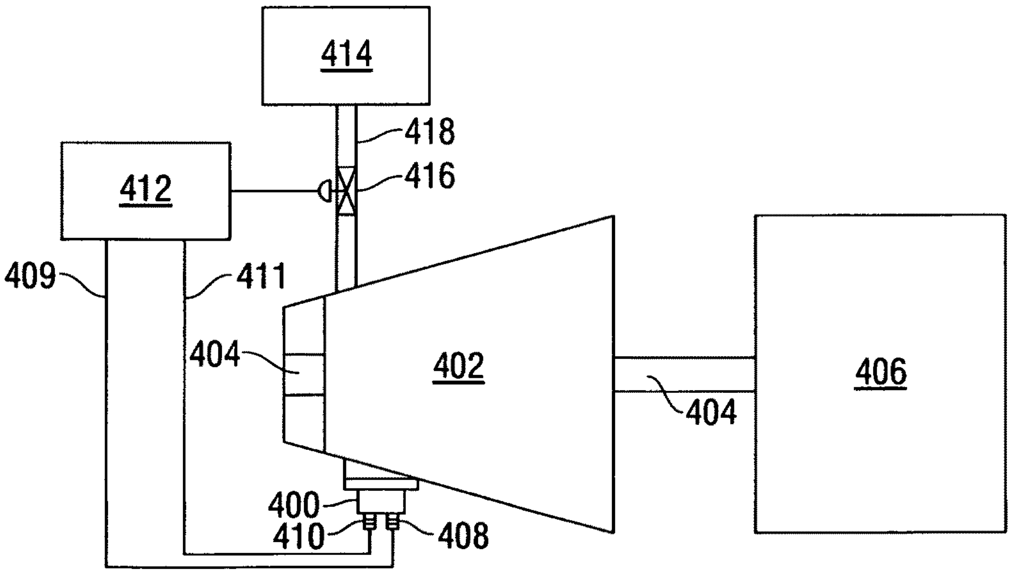

FIG. 1C illustrates in block diagram the electronic probe housing 400 according to the present invention in use with a steam turbine 402 having a rotatable drive shaft 404 between the housing 400 and the turbine 402, and between the turbine 402 and the load 406, which may be any rotatable equipment, such as a generator, a pump, a compressor or the like.

FIG. 1C also illustrates a pair of magnetic pickup sensors 408 and 410 coming out of the probe housing 400, and having electrical lines 409 and 411 leading into the electronic governor 41. A source of pressurized steam 414 is connected through one or more valves 416 in steam pipe 418 into the steam turbine 402 to drive the turbine blades therein.

Figure 1D:
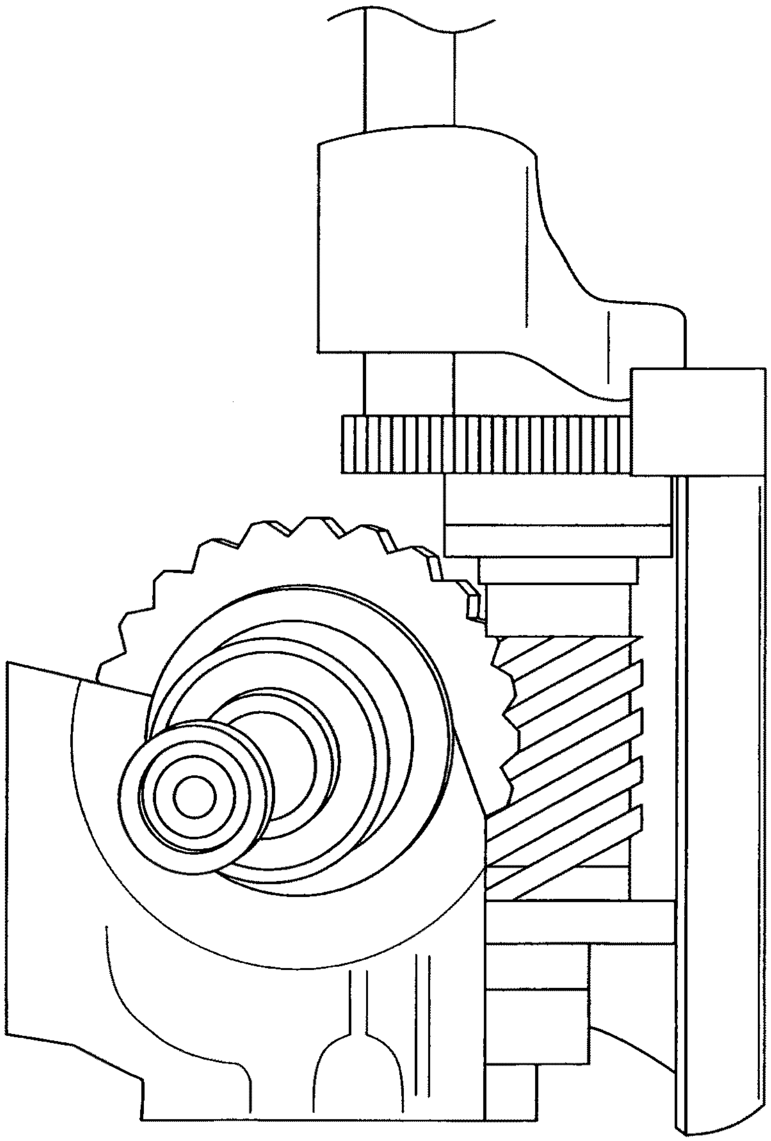
FIG. 1D (Prior Art)
FIG. 1D is a pictorial view of a worm and worm gear as used in FIG. 1C.

The only difference between the embodiments of FIGS. 1B and 1C is the use of a conventional worm and a worm gear, illustrated in FIG. 1D within the steam turbine 402 which causes the drive shaft 404 to exit the lower side of the steam turbine 402 instead of at the back side of the steam turbine. As is well known, the worm gear drive has its drive axes at 90° to each other, and is typically used to decrease speed and to increase torque.

Figure 2:
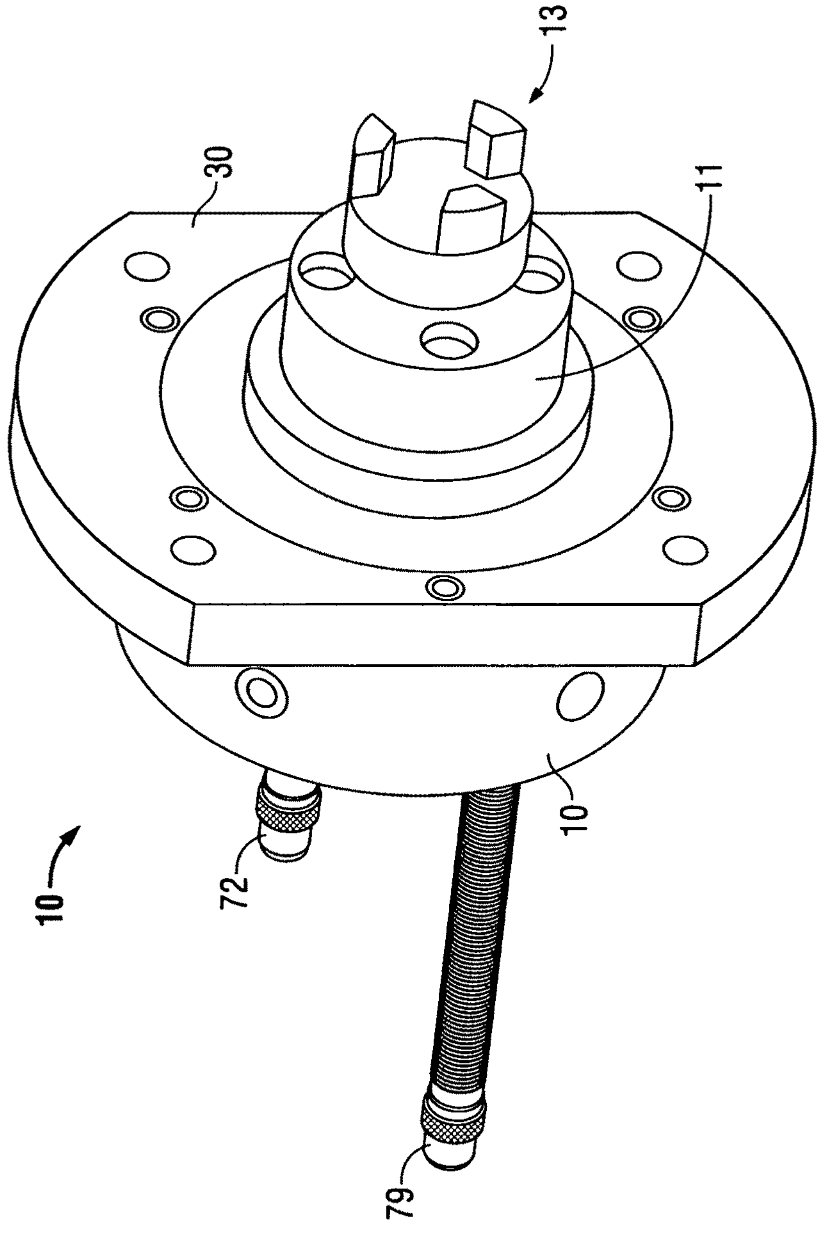
FIG. 2 is a pictorial view of the electronic probe housing according to the invention.
Figure 3:
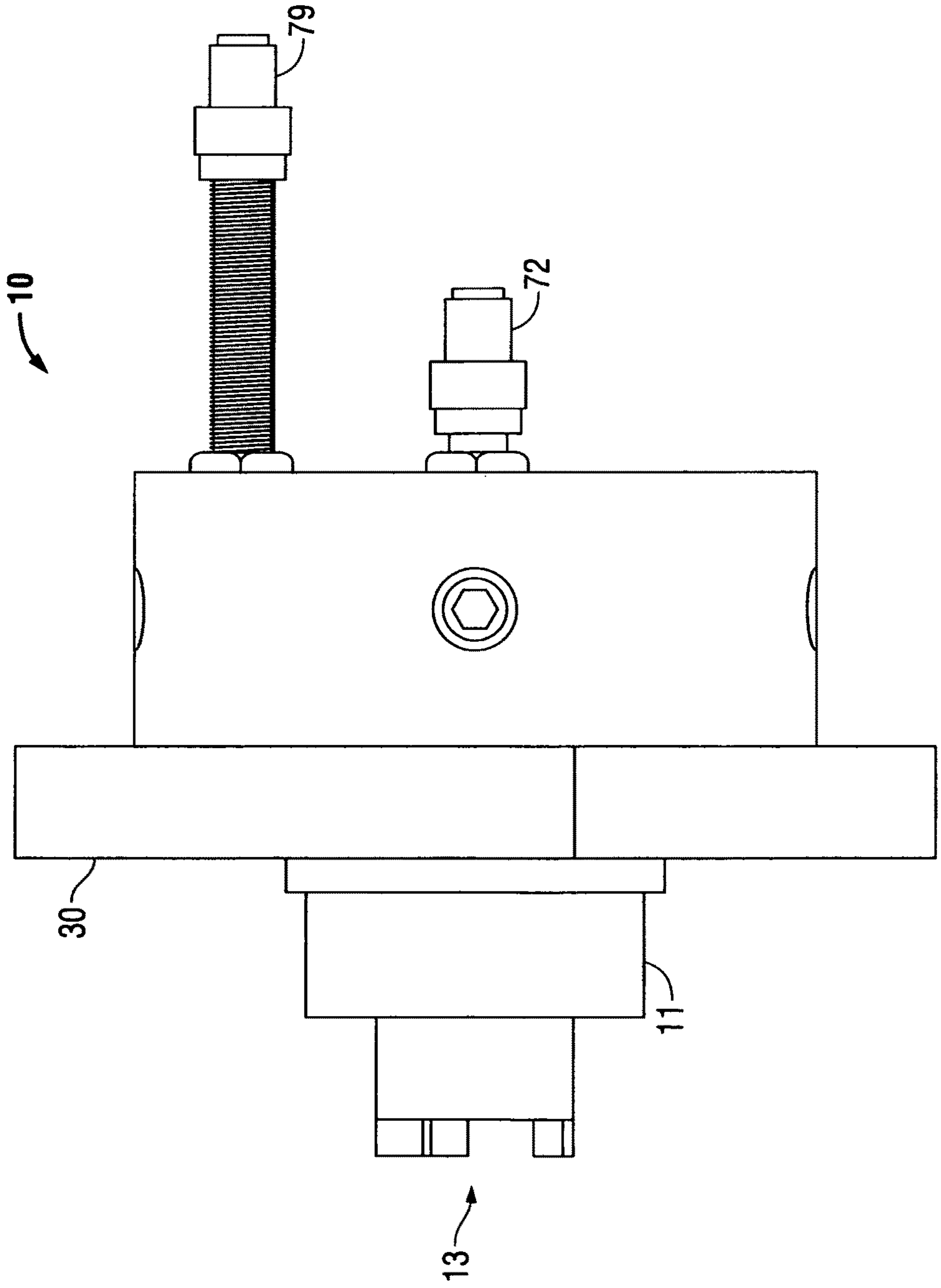
FIG. 3 is a pictorial view of the electronic probe housing according to the invention.
Figure 4:
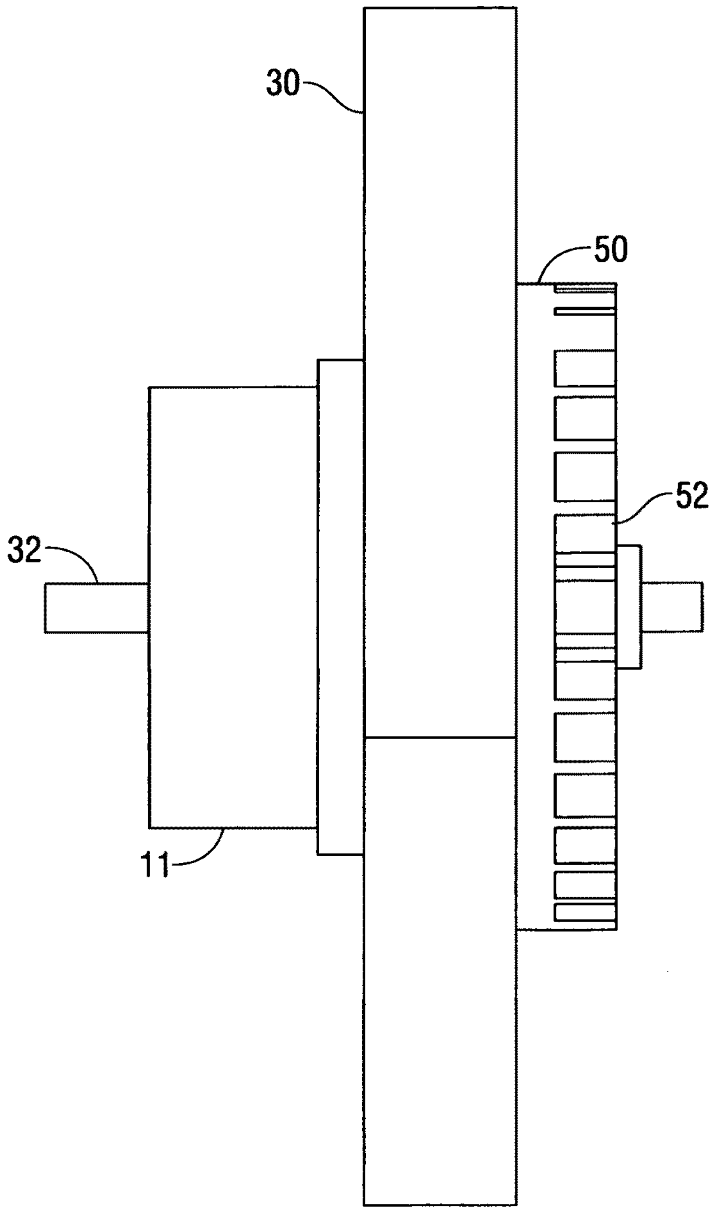
FIG. 4 is a pictorial view of the electronic probe housing according to the invention.

FIGS. 2, 3 and 4 pictorially illustrate an electric probe housing 10 according to the invention, the individual components of which are illustrated and described hereinafter in greater detail.

FIGS. 2 and 3 illustrate in two views the completely assembled electronic probe according to the invention, including the end cap 11, the back plate 30, the housing 10 and the probes 72 and 79. The known coupling 13 is commercially available from Lovejoy, Inc., preferable their Model “L”, located at 2655 Wisconsin Avenue, Downers Grove, Ill. 60515. This coupling is used to connect the second end of the small drive shaft 32 to the main drive shaft.

FIG. 4 illustrates the partial assembly of the electronic probe according to the invention, illustrating the gear ring 50 and its extensions 52, but not yet showing the remainder of the housing 10 which will surround and enclose the gear ring 50 as illustrated in FIGS. 2 and 3, and does not yet show the fixture 12 as is illustrated in FIGS. 2 and 3.

Figure 5B:
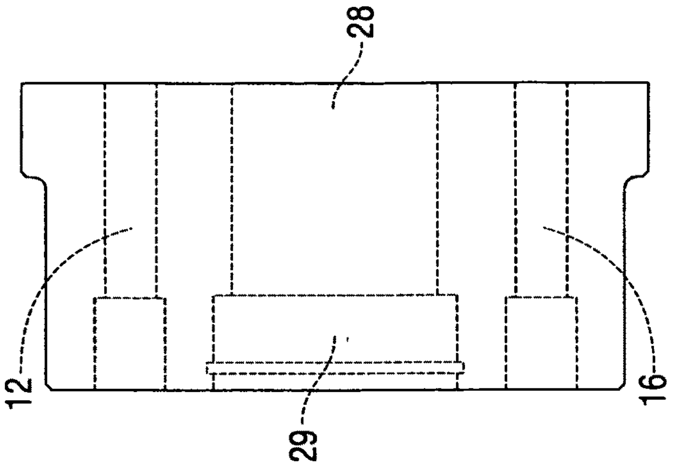
FIG. 5B is a cut-away side view of the end cup illustrated in FIG. 5A according to the invention.
Figure 5A:
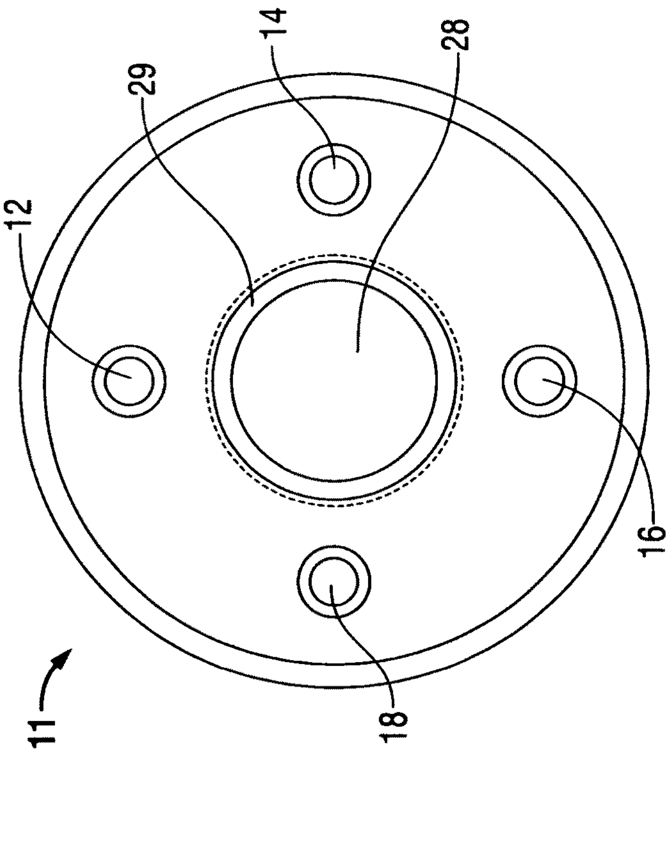
FIG. 5A is a top plan view of the end cap used with the electronic probe housing according to the invention.
Figure 6A:
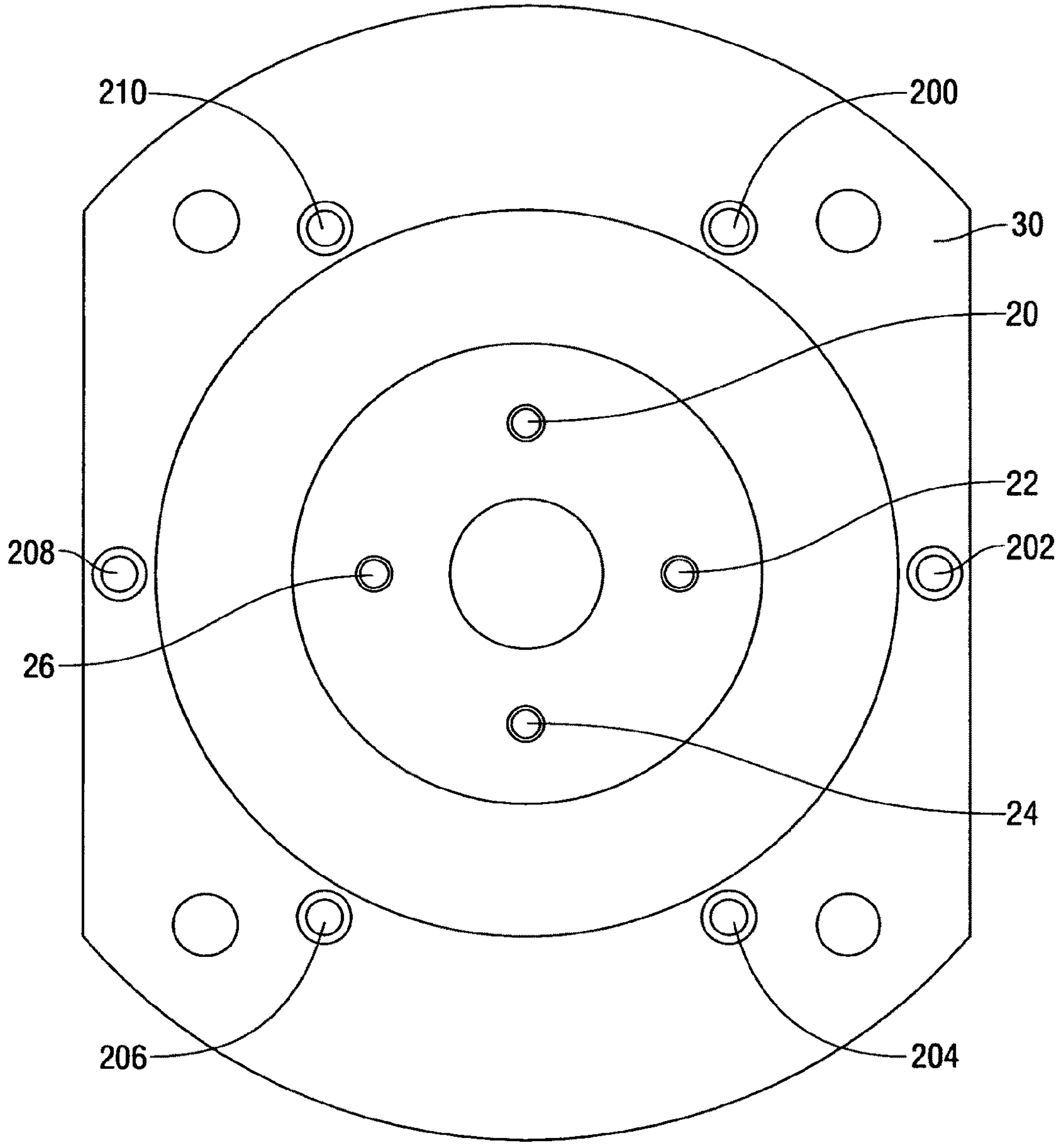
FIG. 6A is a top plan view of the back plate of the electronic probe housing according to the invention.

FIG. 5A illustrates a top plan view of the end bearing cylindrical cap 11 associated with the housing 10, and having four mounting thru-holes 12, 13, 14 and 15 to allow the cap 11 to be threadedly connected to the four holes 20, 22, 24 and 26 in the back plate 30 illustrated in a top plan view in FIG. 6A. The housing 10 also has thru-hole 28 and bearing 29 through which a drive shaft 32 extends. FIG. 5B illustrates a cut-away side view of the end cap 10.

Figure 6B:
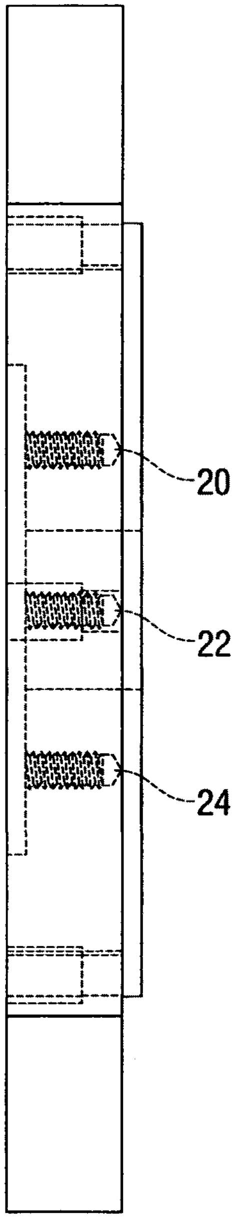
FIG. 6B is a cut-away view of the back plate illustrated in FIG. 6A.

Referring further to FIGS. 6A and 6B, the back plate 30 is essentially cylindrical in shape other than for having two of its opposing sides parallel. The plate 30 has a central thru-hole 34 mating with the thru-hole 28 of the cap 10 shown in FIG. 5A. The thru-hole 34 also has a bearing therein, if desired, to facilitate rotation of the shaft 32.

Figure 7:
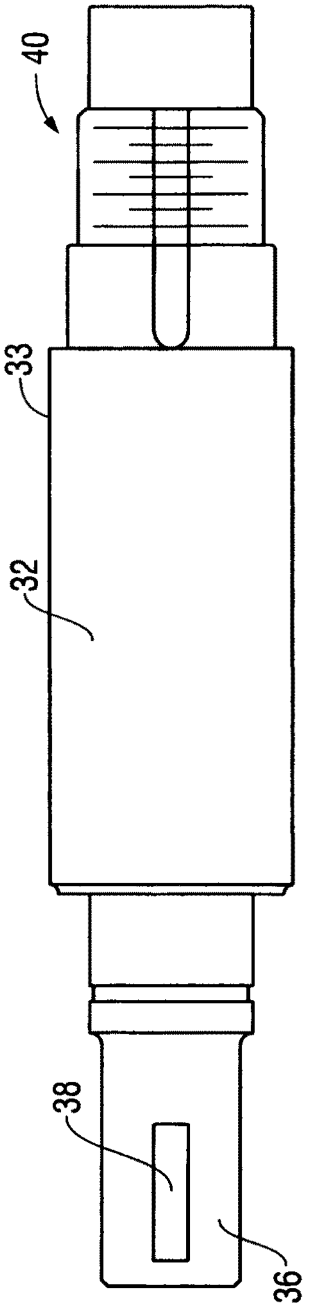
FIG. 7 is a pictorial side view of a short section of drive shaft used inside the electronic probe housing according to the invention.

FIG. 7 illustrates a short length of rotatable drive shaft 32 having a central raised surface long enough to snugly fit within the thru-holes 28 and 34 and the bearings therein to avoid vibration. The end 36 of drive shaft 32 preferably has a Woodruff key 38 for attachment to a key seat, all as is well-known in the art for forming a keyed joint between a pair of objects. The other end 40 of the drive shaft 32 has a bearing nut 42.

Figure 8B:
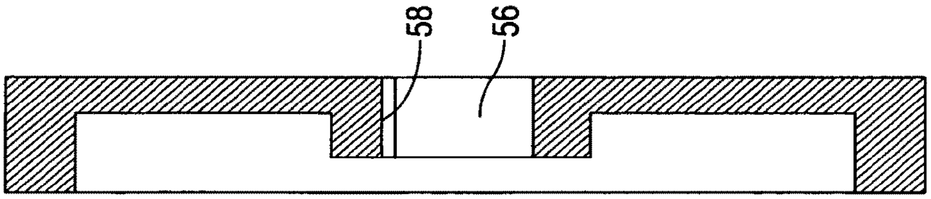
FIG. 8B is a cut-away side view of the gear ring illustrated in FIG. 8A according to the invention.
Figure 8A:
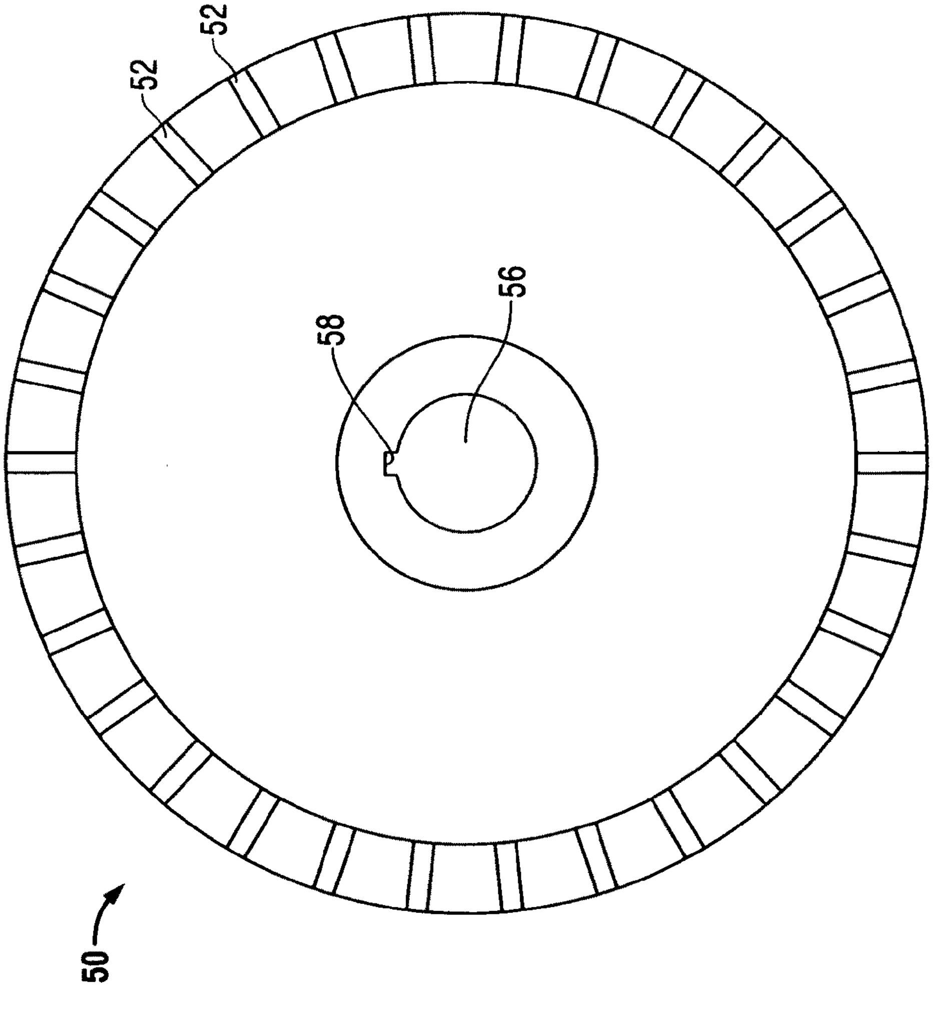
FIG. 8A is a top plan view of a gear ring according to the invention.

FIG. 8A illustrates a top plan view of a gear ring 50 preferably having thirty extended positions 52, the number thirty for such extended portions being preferable only because alternating current typically is 60 Hz, thus making the calculations and calibrations easier to compute. Some geographic regions are known to use 50 Hz, so it may be appropriate to use twenty five extensions instead of thirty.

The gear ring 50 also has a central raised, cylindrical portion 54 having a thru-hole 56 and a key seat 58 to accommodate a key on the shaft 32 to prevent relative rotation between the gear ring 50 and the shaft 32.

Figure 9A:
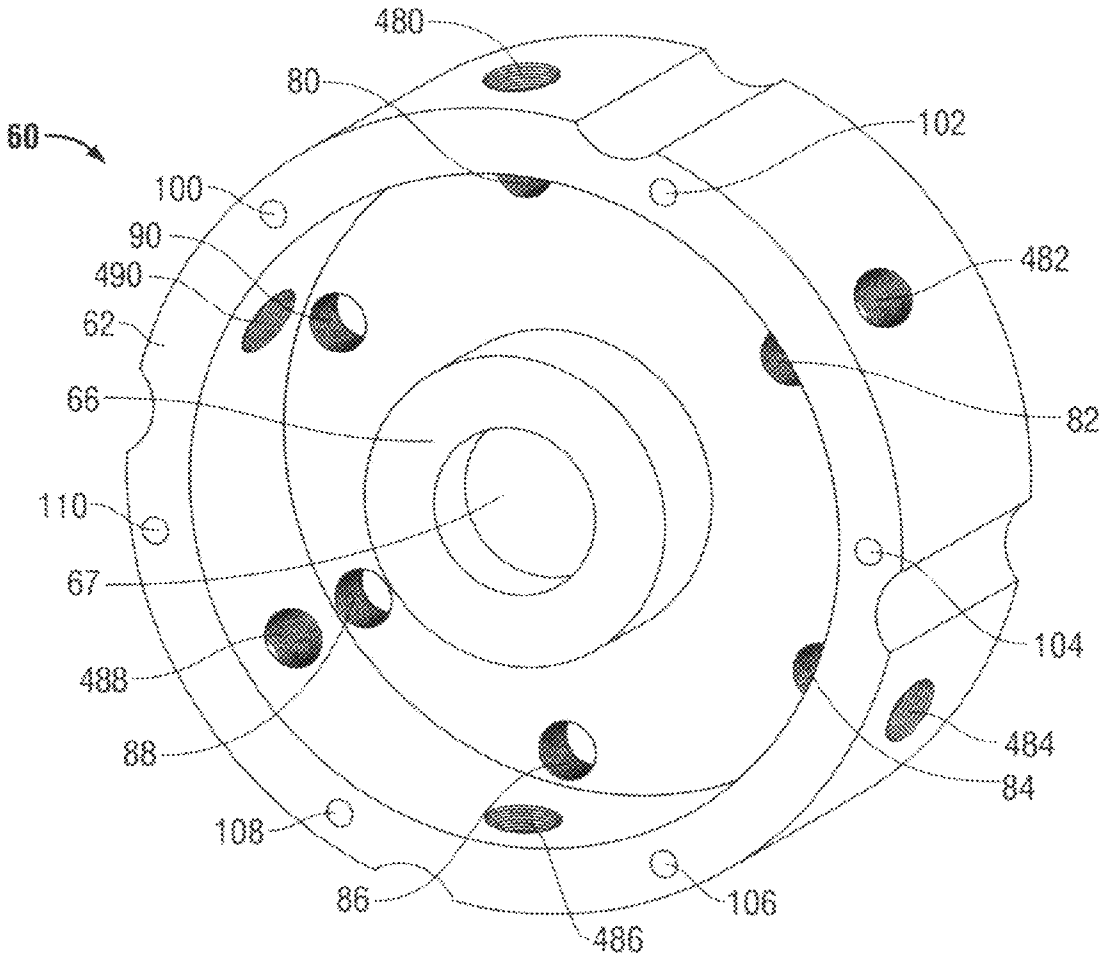
FIG. 9A is a pictorial view of the sub-housing used with the electronic probe housing of FIGS. 2A, 3A and 4A according to the invention.
Figure 9B:
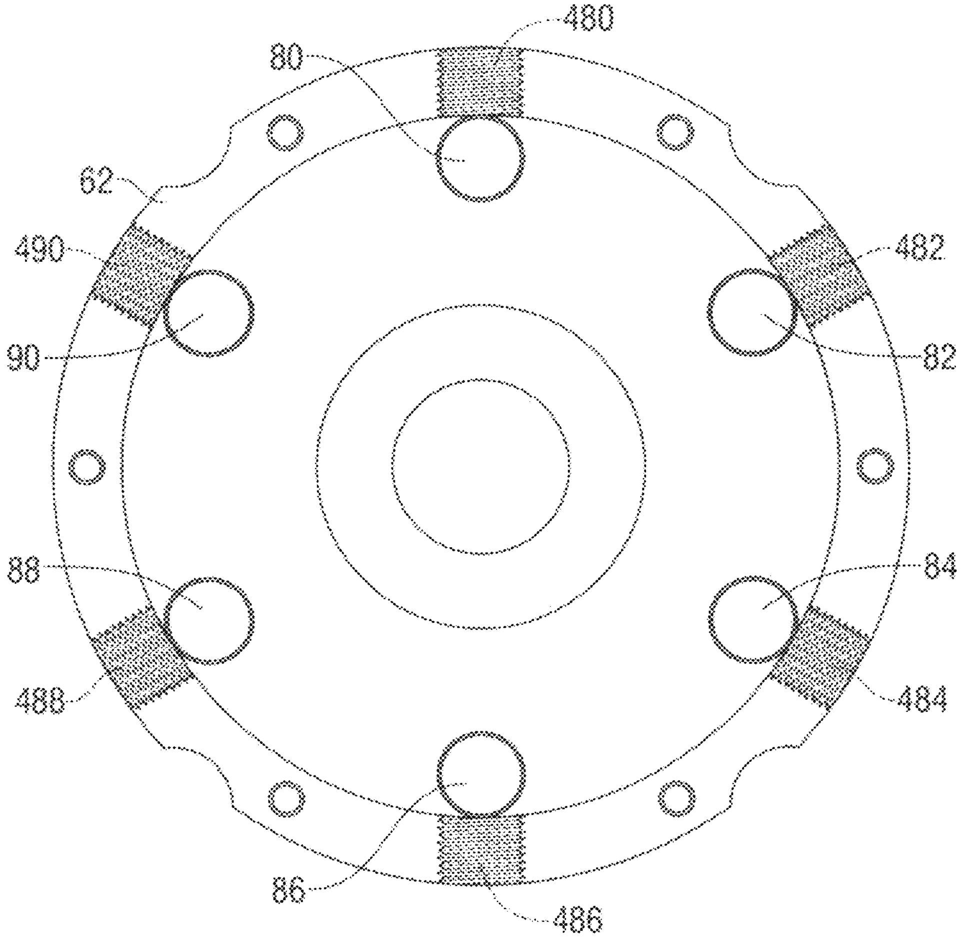
FIG. 9B is a top plan view of the sub-housing illustrated in FIG. 9A.

FIG. 9A is a pictorial view of an electronic probe sub-housing 60 having a cylindrical wall 62, a top cover plate 64 and a central, raised portion 66 having an opening 67 partially there-thru to accept the end 40 of the drive shaft 32. The top cover plate 64 of the sub-housing 60 has six (6) holes, 80, 82, 84, 86, 88 and 90 there thru for the insertion of one or more magnetic pickup probes, preferable the two probes 72 and 79.

FIGS. 2, 3, 9A and 9B illustrate a plurality of side holes 480, 482, 484, 486, 488 and 490 through the side wall 62. The side holes are aligned to provide access to the probes (72, 79) inserted through one or more of the holes 80, 82, 84, 86, 88 and 90, thus providing a method for calibrating the air gap between the probe (72, 79) and the extensions 52 in FIG. 8A. For example, side hole 4 80 aligned with the hole 80, etc.

Figure 10:
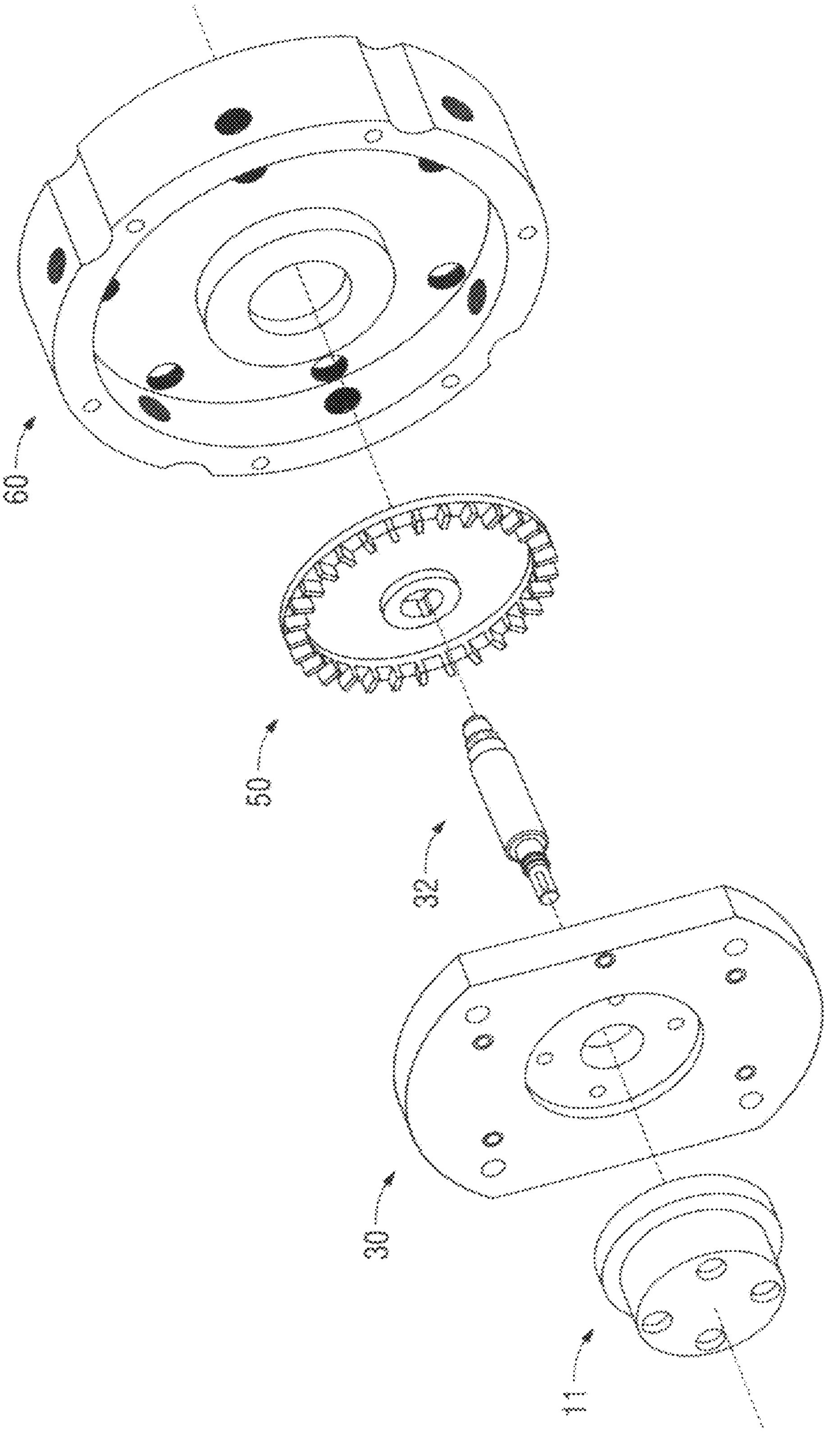
FIG. 10 is a pictorial view of the electronic probe housing prior to being assembled according to the invention.

In the assembly of the components illustrated in FIG. 10, the end cap 11 is first threadely attached through the use of threaded bolts through the mounting holes 12, 14, 16 and 18, and the mating holes 20, 22, 24 and 26, respectively. Alternatively, the cap 11 and plate 30 can be cast, milled or otherwise formed as a single component from a castable or millable material, for example, cast iron. The end 36 of draft shaft 32 is inserted within the thru-holes 28 and 34, and then through the thru-hole 56, until the key on the exterior surface of shaft 32 is seated within the key seat 58. With this assembly, the end 40 of the shaft 32 is rotatably seated in the receptacle 67.

Although not illustrated in FIG. 4A, one or more electronic probes (magnetic pickup devices) such as the two probes 72 and 79 can be inserted through two of the thru-holes 80, 82, 84, 86, 88 and 90 to be proximate to the rotating gear ring and its extended elements 52.

The surface 62 of the sub-housing 60 illustrated in FIG. 9A is then moved against the back plate 30, thus enabling the housing 60 and plate 30 to be threaded connected together, through the use of threaded bolts through the holes 100, 102, 104, 106, 108 and 110, and the holes 200, 202, 204, 206, 208 and 210 respectively.

Figure 11:
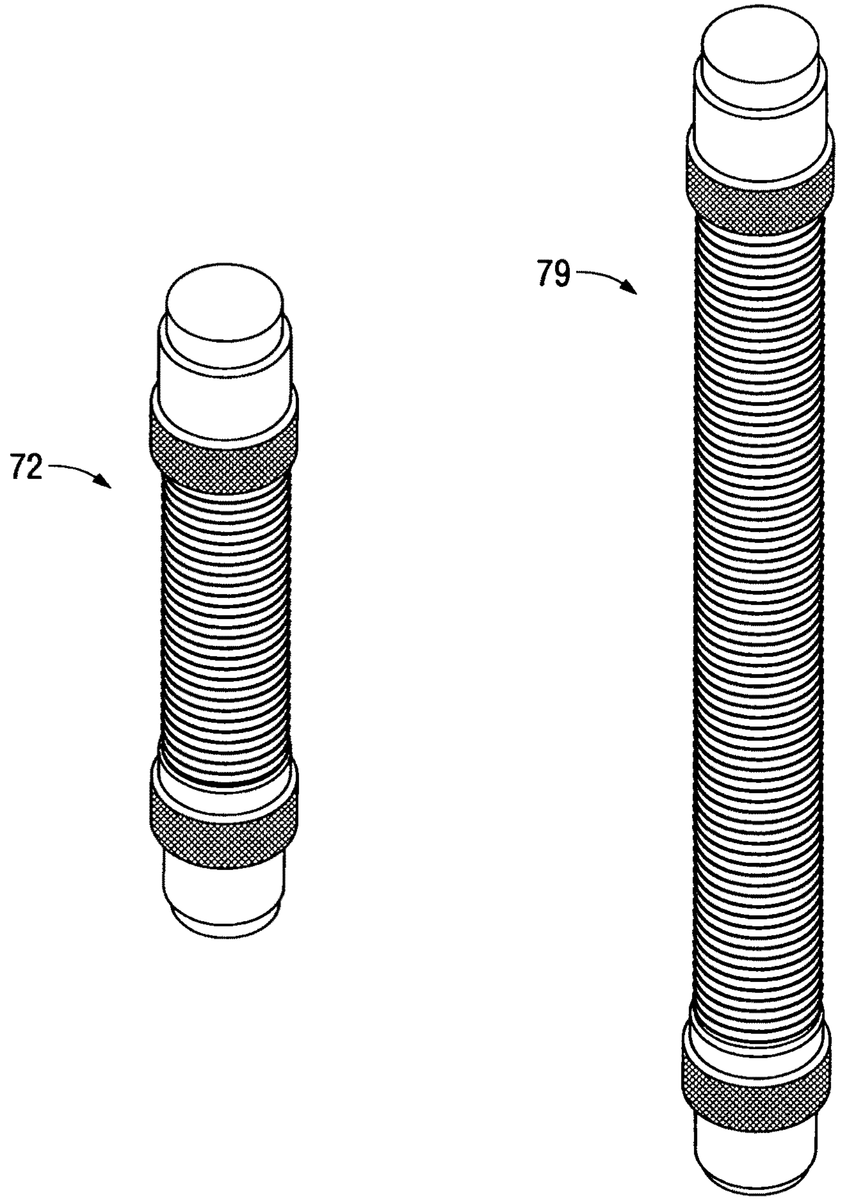
FIG. 11 is a pictorial view of two of the magnetic sensor probes used in accordance with the invention.

Referring now to FIG. 11, there is illustrated an exemplary magnetic probe (72, 79) which can be used in practicing the invention. The invention can be practiced through the use of a single such probe, as for example probe 72 or probe 79, but preferably as both probes 72 and 79 as discussed herein above with respect to FIG. 9. The invention also contemplates the use of more than two such probes.

Operation.

The gear ring 50 and its thirty extensions 52 are, in the preferred embodiment, fabricated from a ferrite material, for example, 4140 steel. However, the gear ring can be made, in a less preferable embodiment, from aluminum, for various reasons, including costs, ease of manufacture, weight and lack of oxidation. Aluminum is generally characterized as being non-magnetic. However, aluminum acts as if it is magnetic when subjected to a moving magnetic field. In 1833, Heinrich Emil Lenz formulated what is now known as “Lenz’s Law”, which states that when a current is induced, it always flows in a direction that will oppose the change in magnetic field that causes it.

Be that as it may, the preferred embodiment of the invention calls for the gear ring and its extensions to be fabricated from a ferrite material, and more preferably, from 4140 steel. The other components of the electronic probe housing according to the invention are preferably fabricated from aluminum.

The magnetic pickup device can be purchased from many different sources, such as Daytronics Corporation, 2566 Kohnle Drive, Miamisburg, Ohio (USA) 45312, for example, their model no MP1A.

A magnetic pickup is essentially a coil wound around a permanently magnetized probe. When discrete ferromagnetic objects—such as gear teeth, turbine rotor blades, slotted discs, or shafts with keyways—are passed through the probe's magnetic field, the flux density is modulated. This induces AC voltages in the coil. One complete cycle of voltage is generated for each object passed.

If the objects are evenly spaced on a rotating shaft, the total number of cycles will be a measure of the total rotation, and the frequency of the AC voltage will be directly proportional to the rotational speed of the shaft.

Output waveform is a function not only of rotational speed, but also of gear-tooth dimensions and spacing, pole-piece diameter, and the air gap between the pickup and the gear-tooth surface. The pole-piece diameter should be preferably less than or equal to both the gear width and the dimension of the tooth's top (flat) surface; the space between adjacent teeth should be approximately three times this diameter. Ideally, the air gap should be as small as possible, typically 0.005 inches. Thus, the devices 72 and 79 should be located, not quite touching, but very near to the extended elements 52 when the gear ring 50 is spinning.

Referring further to the embodiment of FIGS. 1B and 1C, the values to be used in the governor are first set, as is well known in this art. In the preferred embodiment, first assume that both magnetic sensors 72 and 79 are in place, one for measuring the RPM of the drive shaft causing the load to spin, and the other to generate electricity to operate the system, including the governor. Alternatively, both of the probes can be the same length, and both can be used to measure the RPM of the drive shaft, and both can be used to generate electricity as needed.

The governor preferably is set to allow some degree of speed change without adjusting the valve or valves, commonly referred to as "lead-lag" compensation. For example, the desired RPM may be set at 200 RPM, ±5 RPM. In this example, the valve or valves will not be changed so long as the RPM as determined by the probe 72 or 79, as the case may be, to be between 195 RPM and 205 RPM. Once the RPM is outside the range of 195-205 RPM for a given time interval, for example, for ten (10) seconds, then the valve or valves will be adjusted to bring the RPM to the desired range, as appropriate.

As an additional important feature of the present invention, the back plate 30 of FIG. 6A has the six (6) mounting holds 200, 202, 204, 206, 208 and 210 there-thru which allow the electronic probe housing in accordance with the invention to be used, without any significant modification, with all existing makes and models of commercially available steam turbines throughout the world.

There has thus been illustrated and described herein an electronic probe, according to the invention, housing which is easily mounted onto nearly every make and model of steam turbines, characterized by an inner chamber in the housing surrounding a first end of a drive shaft upon which the turbine blades are mounted, and being further characterized as having a gear ring within the inner chamber fixedly attached to the first end of the drive shaft. The gear ring has a plurality of spaced extensions, fabricated preferably from a ferrite material, and even more preferably from 4140 steel. At least one, preferably two magnetic pickup sensors are mounted at least partially, within the inner chamber of the housing in near proximity to the spaced extensions as the gear ring revolves with the drive shaft while the magnetic pickup device or devices remain stationary within the housing. During the operation of the steam turbine, the electronic probe housing automatically sends electric signal to an electronic governor which, with no human intervention, will cause the RPM of the steam turbine to increase, decrease or remain constant.

Figure 12A:
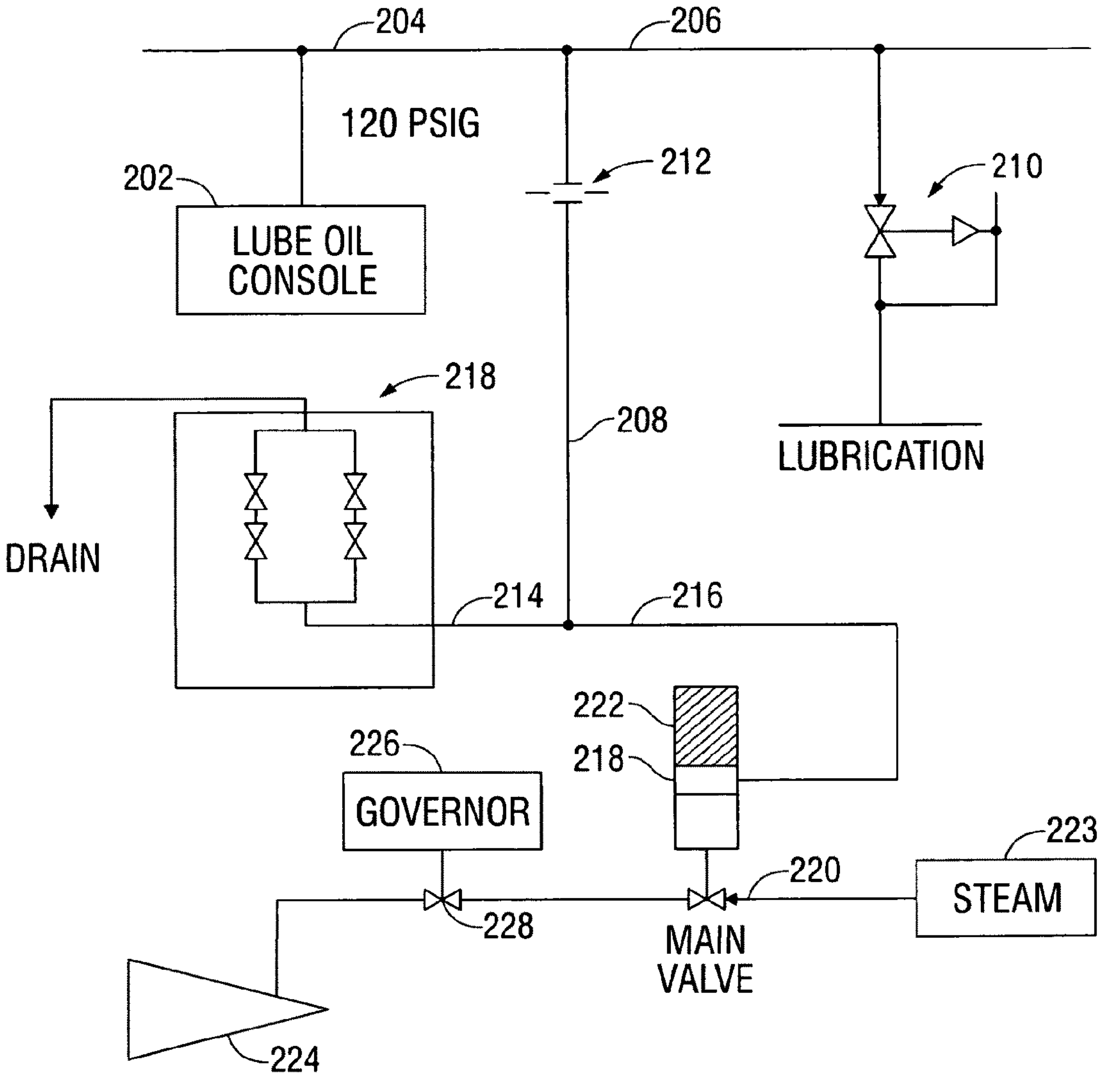
FIG. 12A is a schematic block diagram of the overall system for shutting down of the steam turbine according to the invention.

Referring now to FIG. 12A, there is a schematic diagram showing the use of high pressure lubrication oil in accordance with one embodiment of the invention to cause the steam turbine to automatically cut off in the eventuality of the turbine speed reaching or exceeding its intended limits.

FIG. 12A shows a lube oil console 202 which contains a supply of lube oil and a conventional pump for pressurizing the lube oil. The specific oil may be required to operate at various pressures, but to illustrate the invention it can be assumed the pressure should be maintained, for example at 120 PSIG. The output of the console 202, moving along the conduit 204, is then divided along the conduits 206 and 208. A ⅛" orifice 212 is located in the conduit 208 to limit the flow of oil into the conduit 208 and to limit the flow of oil out of conduit 204.

The conduit 206 leads to a valve 210 to provide lubrication where needed, for example, in the turbine 224. The conduit 208 is divided into conduits 214 and 216.

Figure 12B:
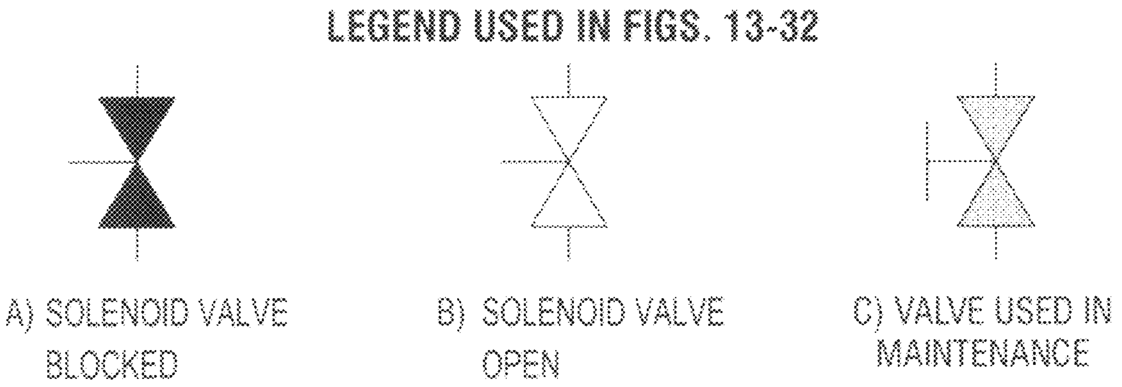
FIG. 12B is the Legend used with the logic used in FIGS. 13-32.

The block 218 receives the pressurized lube oil from the conduit 214, and schematically shows four solenoid valves which are identified as SV1, SV2, SV3 and SV4 in FIGS. 13-32 hereinafter. FIG. 12B illustrates the Legend used in FIGS. 13-32.

Referring again to FIG. 12A, main valve 220 controls the steam from the steam source 223 to the turbine 224. The actuator 218 maintains the main valve 220 normally in the closed position because of the spring 222. Pressurized oil supplied by the conduit 216 to the actuator 218 exerts sufficient force on the actuator piston to compress the spring 222 causing the main stream valve 220 to be in the open position allowing the passage of steam into the turbine 224. In the event of losing the high pressure lube oil from the conduit 216, the spring 222 causes the valve 220 to close, and stops the passage of steam to the turbine 224. The governor 226 modulates the valve 228. However, the codes enforced throughout the world generally require a first cutoff valve (220) and a second modulating valve (228).

Referring now to the Legend shown in FIG. 12B, the solenoid valves used in the logic of FIGS. 13-32 are conventional, normally open hydraulic valves which close in response to an electrical signal applied to the coil of the solenoid valve. When such valves are opened by an internal spring, the pressurized lube oil will freely flow through the valve, as illustrated in Legend (b). If, as shown in Legend (a), the valve is closed (blocked) by applying an electrical signal to the coil of the solenoid valve, the valve will allow no hydraulic fluid to pass, i.e., the pressurized lube oil, will not pass through. The valve shown in Legend (c), shown as a stippled pattern, is manually opened or closed, and can be used as needed in maintaining the system.

Figure 12C:
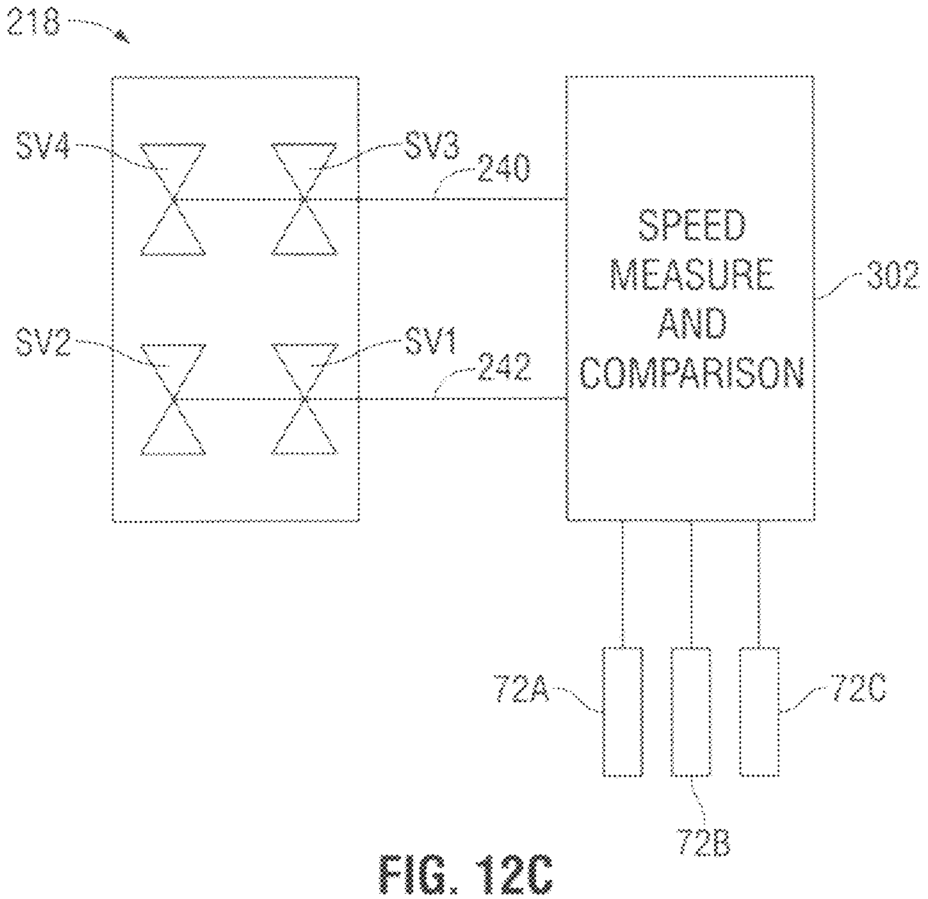
FIG. 12C is a block diagram of the circuitry used to open the block valves based upon overspeed of the steam turbine.

Referring now to FIG. 12(*c*), there is a schematic view of the four (4) solenoid valves SV1, SV2, SV3 and SV4. In addition, there are three (3) speed pickup devices 72A, 72B and 72C. The devices can be identical to the device 72, or the device 79, both illustrated in FIG. 11, or any combination thereof. The three devices provide triple redundancy of the rotational speed of the turbine during use. The device 72A, 72B and 72C can be used as desired, with the apparatus illustrated in FIG. 2.

Referring again to FIG. 12C, the speed outputs of the devices 72A, 72B and 72C are coupled into the circuitry 302.

As a matter of course, the three devices 72A, 72B and 72C will typically result in three slightly different measured speeds, all of which can be used. For example, the middle speed, the average of the three speeds, etc. Whichever speed is used, the circuitry in the Speed Measurement and Comparison configuration 302 will supply an electrical signal to open SV1, SV2, SV3 and SV4 as needed. The speed or speed output is electronically connected (hard wired or wireless) into the four solenoid valves SV1, SV2, SV3 and SV4, through lines 240 and 242.

In the operation of the system, assume that the top safe rotating speed of the turbine shaft is 5000 RPM, and any speed above 5500 RPM is very dangerous. The circuitry in the section then removes an electrical signal to all four (4) solenoid valves, causing each such solenoid valve to open up. Assuming all four (4) solenoid valves are functioning properly, the pressurized lube oil is immediately dumped into the drain. This causes the main valve 220 to close up, with no more steam being sent to the turbine. Shut down of the turbine is complete.

Although the use of a particular system is described in some depth herein for measuring the RPM speed of the rotating shaft, other RPM speed measurement systems are well known, in the art and can be used to generate electrical signals which will cause the logical array of FIGS. 13-32 to either allow the turbine to continue running in a normal mode, and to cause the automatic cutoff of the turbine as contemplated herein.

Referring further to FIGS. 13-32, it should be appreciated that the components in each of said FIGS. 13-32 are identical. Solenoid valves SV1 and SV3 are aligned in series, as a first bank, while SV2 and SV4 are likewise aligned in series, as a second bank. The first and second banks are parallel with each other, running between the "Drain" and the "Trip Header." Three pressure transducers PT01, PT02 and PT03, which may merely be pressure gauges, are used to monitor the pressure of the lube oil in the system. PT01 measures the pressure at a location between SV1 and SV3. PT02 measures the pressure at a location between SV2 and SV4. PT03 measures the pressure at a location identified as the lube oil entering from the Trip Header into the logic shown in each of FIGS. 13-32. A pair of small orifices, usually 1/32" in internal diameter, typically are used on opposite sides of each of the locations monitored by PT01 and PT02 to provide a normal pressure in the cavity between the two solenoid valves in a serial pair that is approximately half of the pressure of the fluid in the trip header. The stippled pattern valves which follow the Legend of FIG. 12(*c*), are used as needed in the maintenance of the system, and can be needle valves and/or other valves which can be manually opened or closed. It should be recognized, however, that most, if not all, the manually open/closed valves are preferably maintained in the open position when the turbine is running normally to allow the lube oil to run through such valves in the logical array of SV1, SV2, SV3 and SV4 may be opened up to turn the turbine off.

Figure 14:
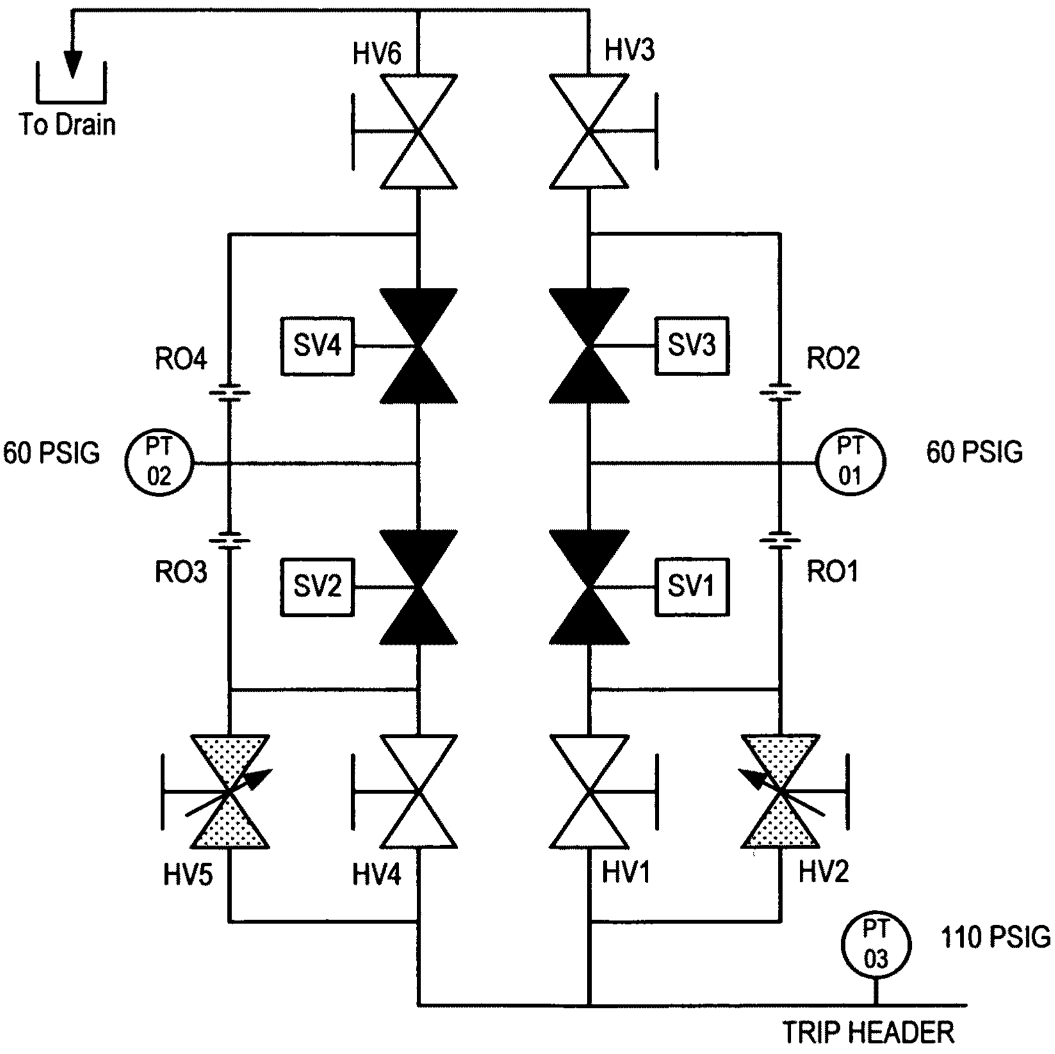

Referring now specifically to FIG. 14, the turbine is running normally, with the PT03 showing a nominal pressure of 110 PSIG, and PT01 and PT02 each showing a pressure of 60 PSIG. In this state, SV1, SV2, SV3 and SV4 are each blocked, based upon there being no indication of overspeed in the turbine being monitored.

Figure 13:
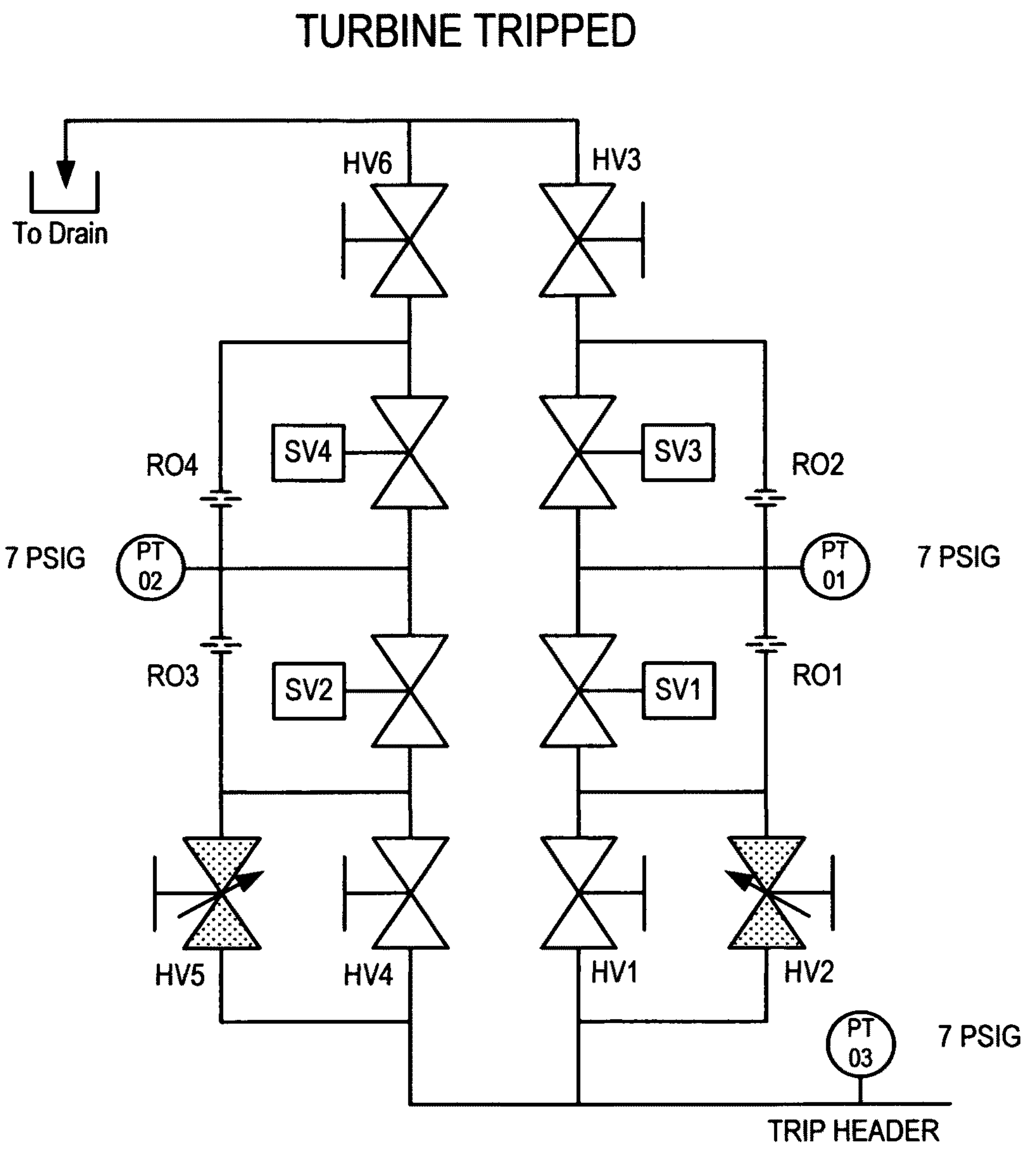
FIGS. 13-32 is the sequence of the logic used according to the invention.

Referring now to FIG. 13, the turbine has been tripped, based upon SV1, SV2, SV3 and SV4 being opened up, presumably because of damage to the turbine, or overspeed, or loss of load. The PT01, PT02 and PT03 measurements according to FIG. 13 have each been reduced from that shown in FIG. 14 down to 7 PSIG. Because of SV1, SV2, SV3 and SV4 being open, nearly all of the lube oil has been forced into the drain.

Figure 15:
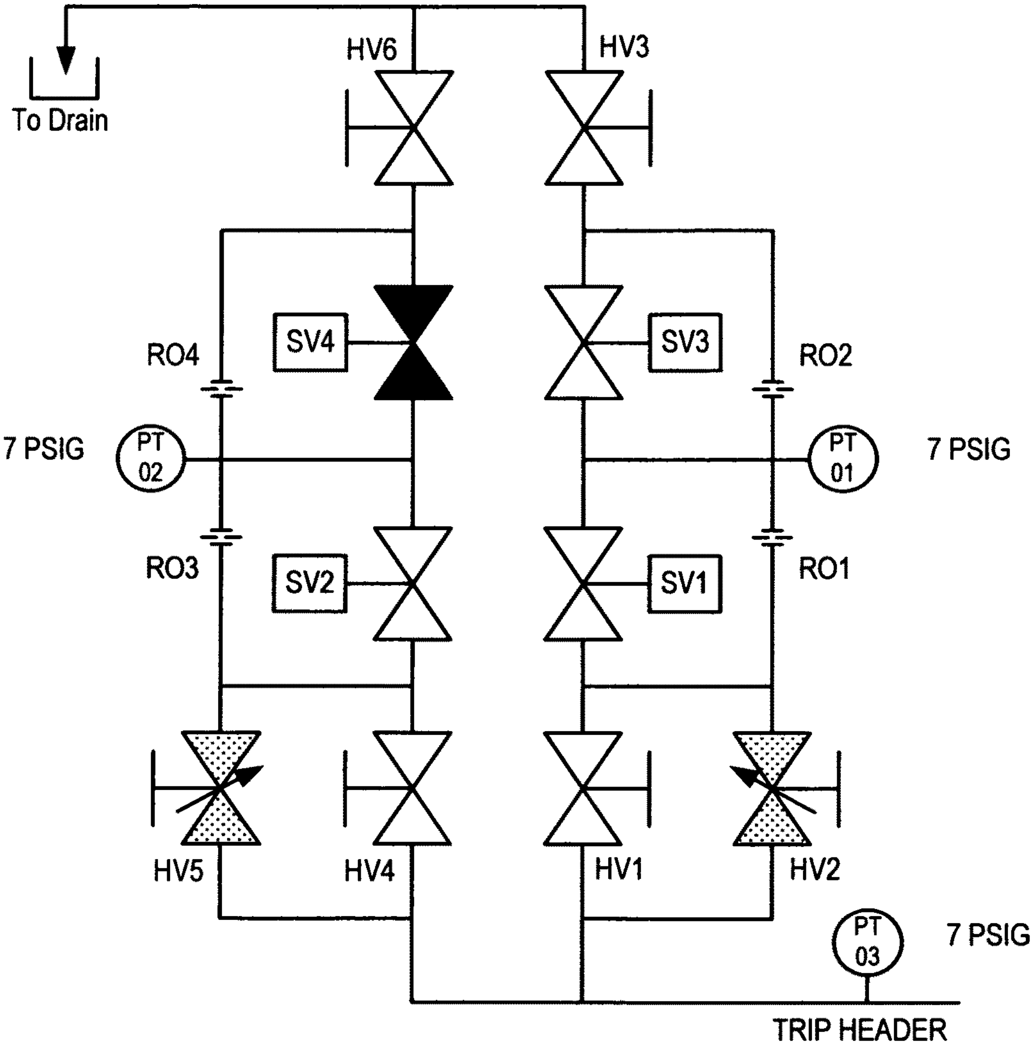

Referring now to FIG. 15, there is shown the turbine tripped, because even with SV4 being closed, the lube oil is forced out into the drain through SV1 and SV3.

Figure 17:
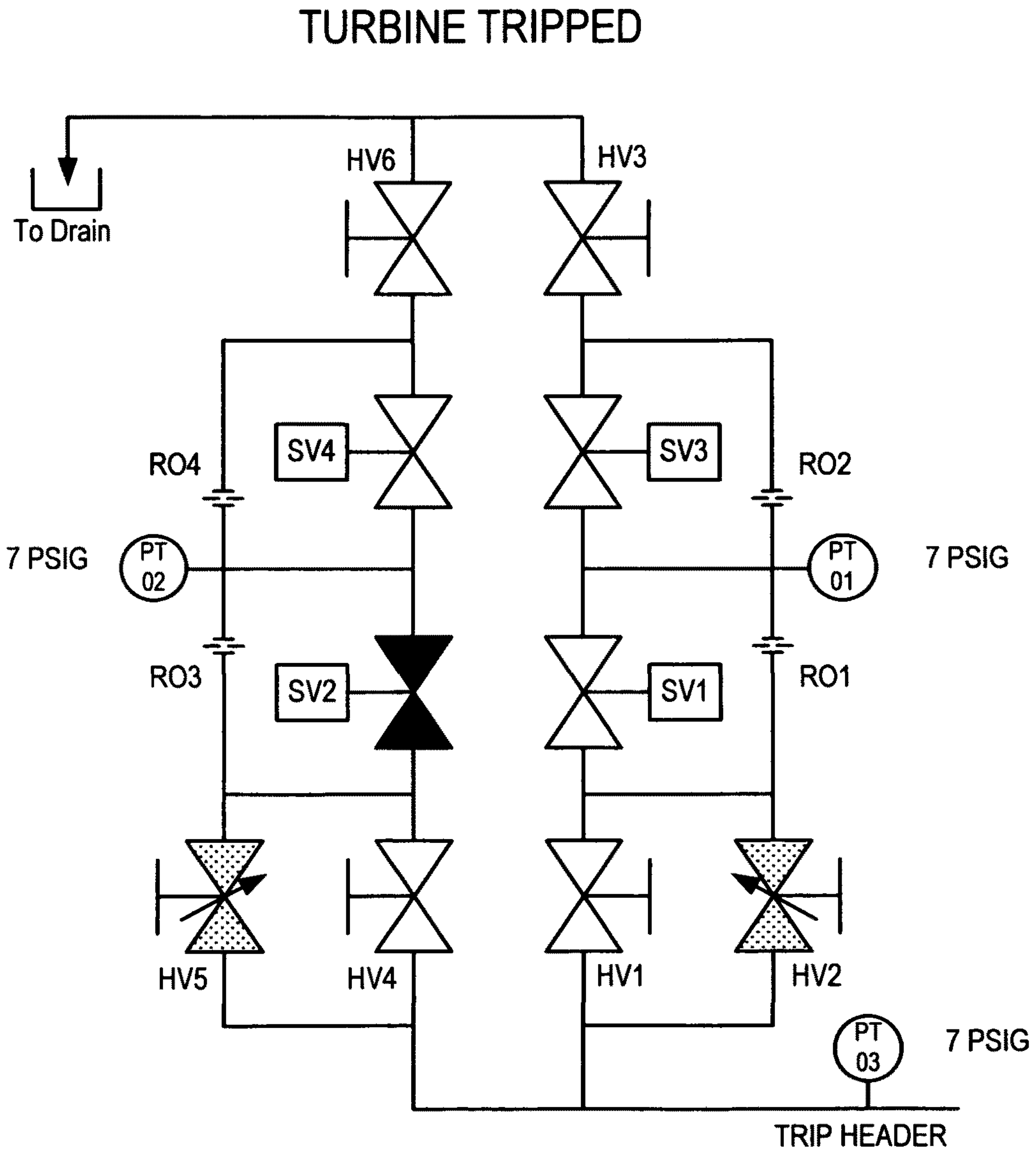

Similarly in FIG. 17, with SV2 being blocked, there is a clear path for the lube oil in the trip header to be forced into the drain through the open solenoid valves SV1 and SV3.

Figure 16:
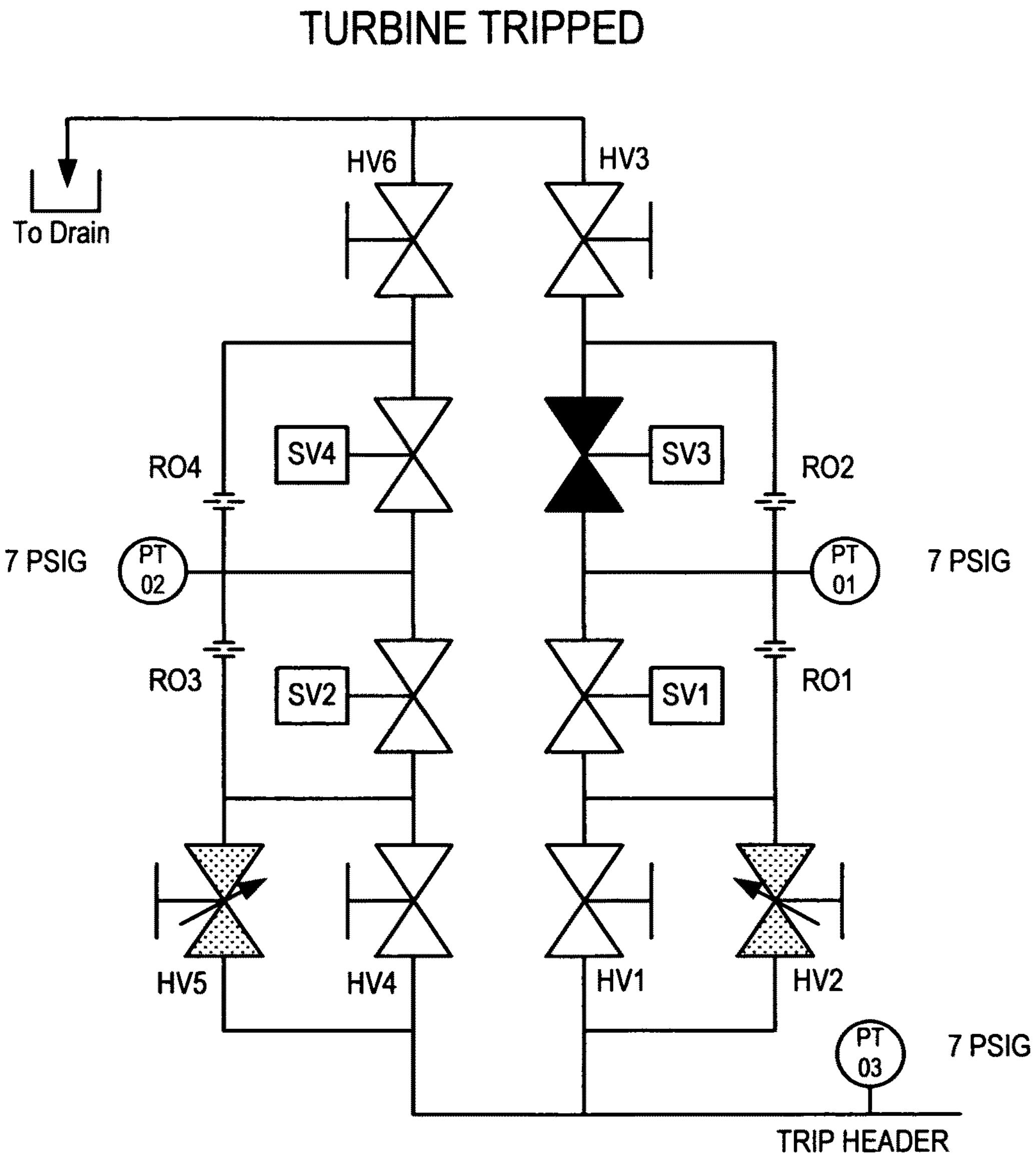
Figure 18:
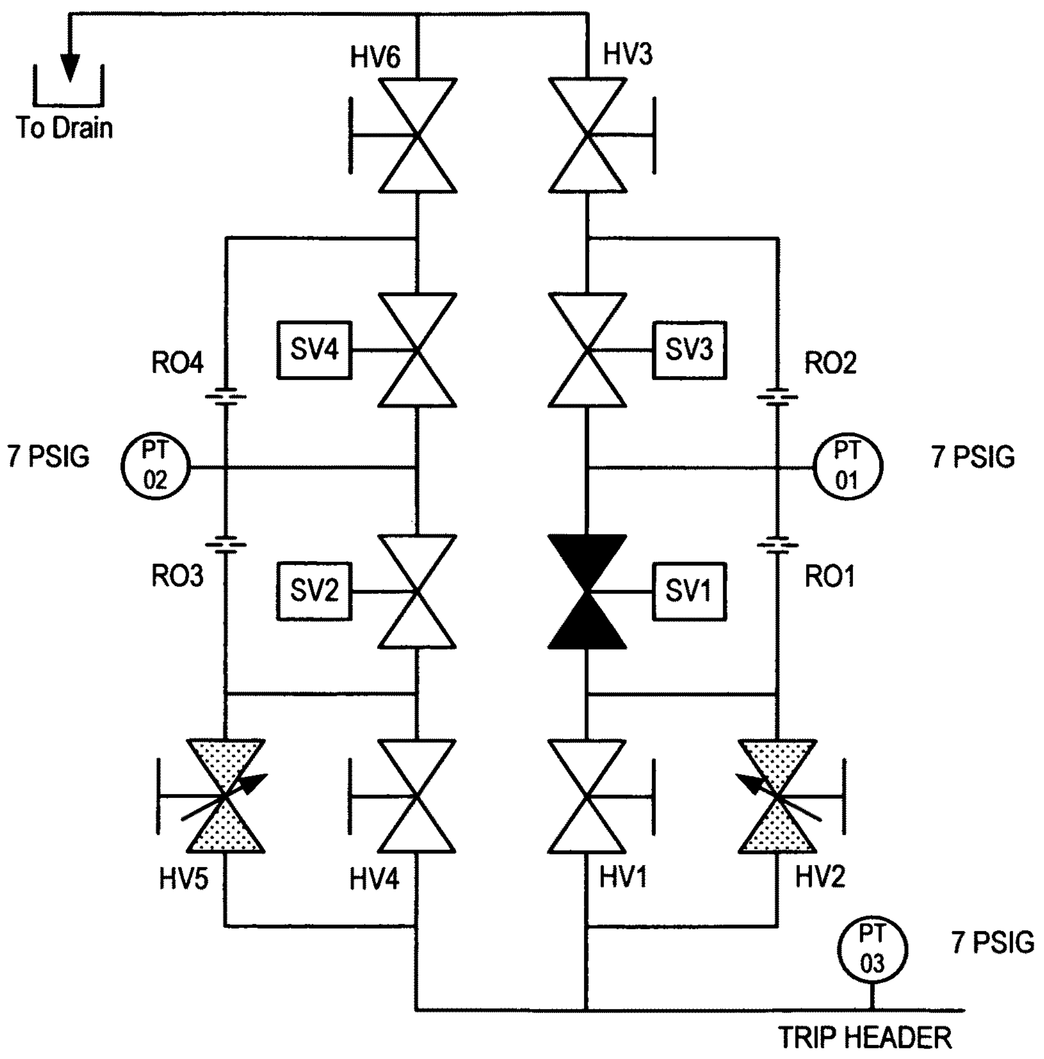

In FIGS. 16 and 18, the turbine tripped because SV2 and SV4 are open providing a clear path for the lube oil in the trip header to be forced into the drain.

Figure 19:
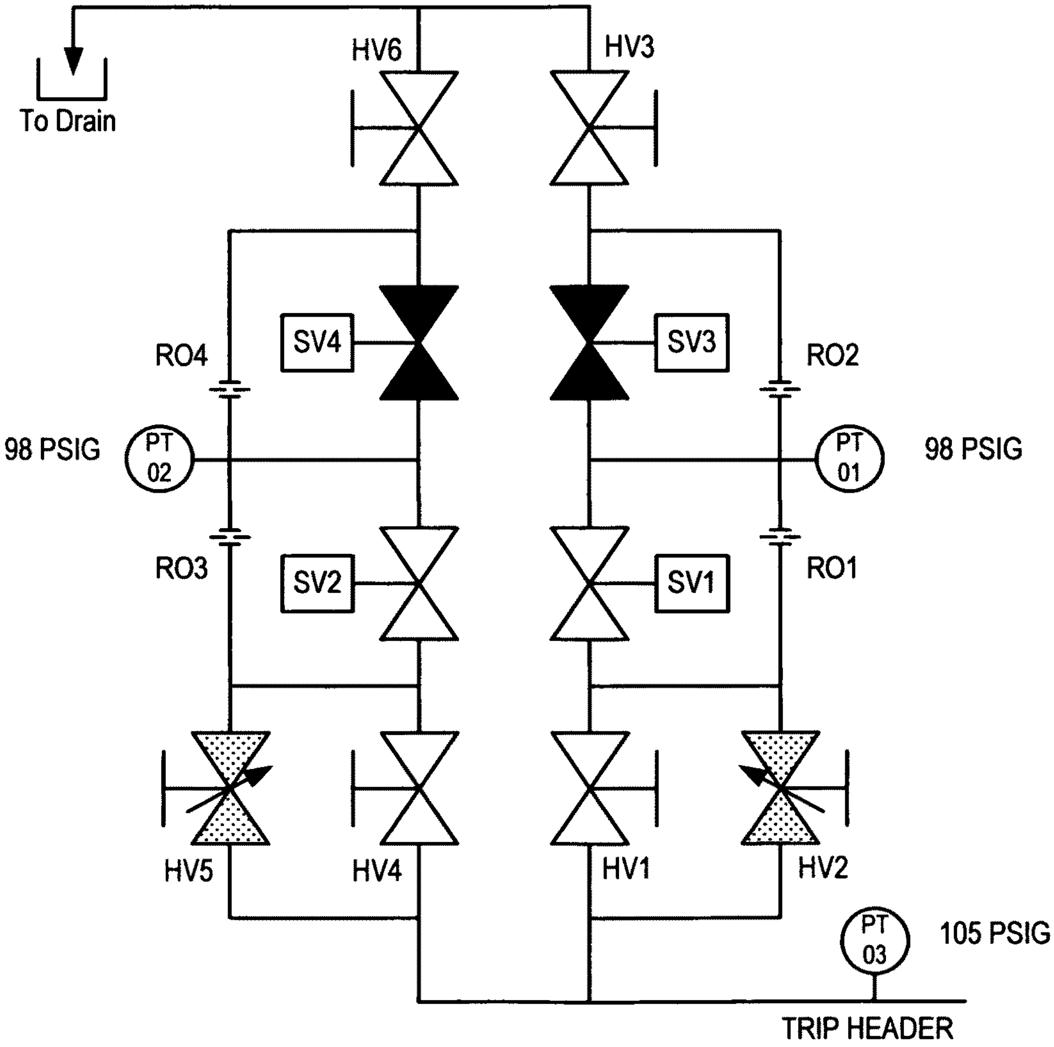

In FIG. 19 because SV3 and SV4 are blocked, there is essentially no lube oil to be pumped through the open valves SV1 and SV2 into the drain, thus allowing the turbine to continue running.

Figure 20:
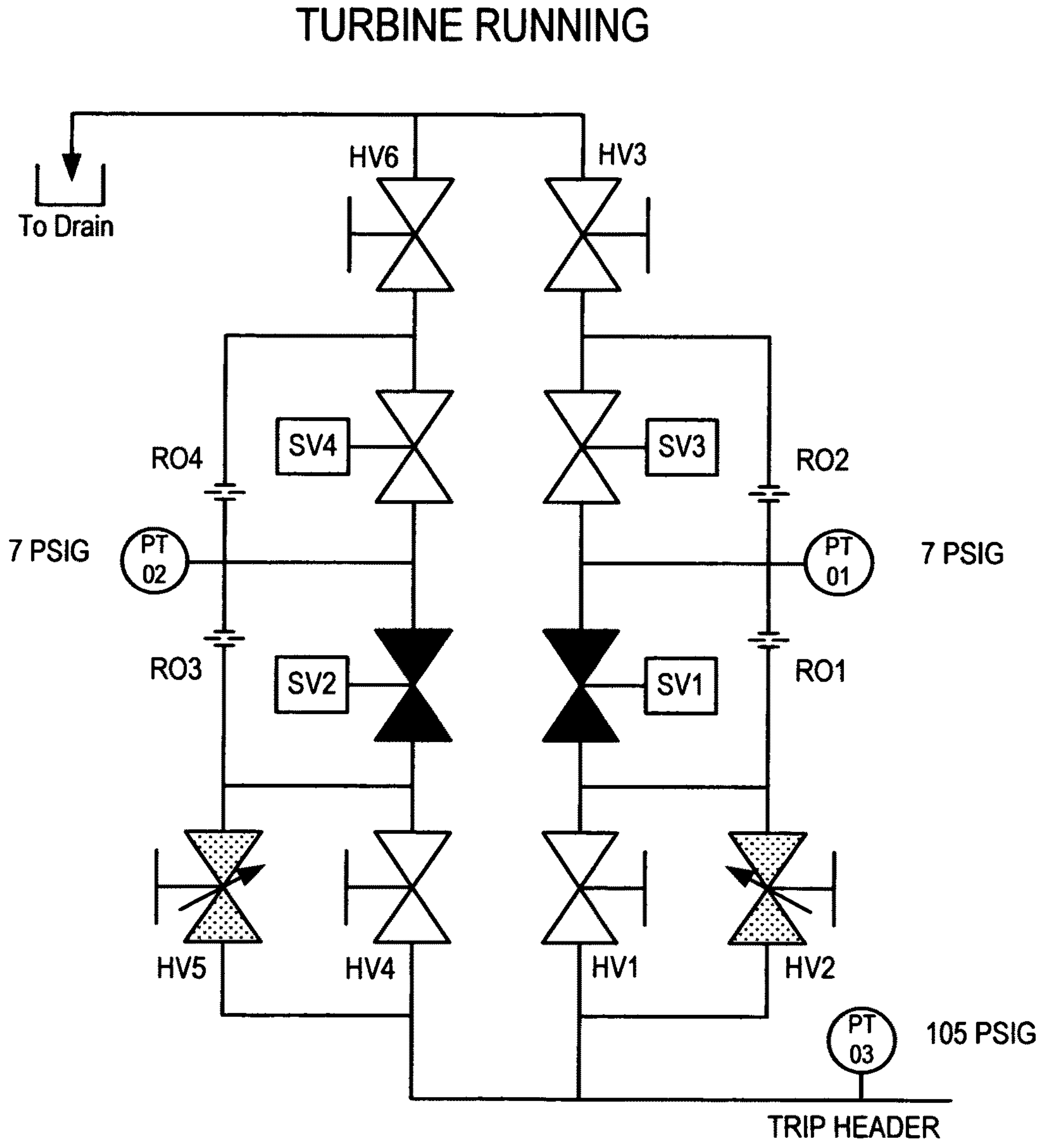

In FIG. 20, SV3 and SV4 are open, but do not allow the lube oil to be forced into the drain, because SV1 and SV2 are blocked, thus allowing the turbine to continue running.

Figure 21:
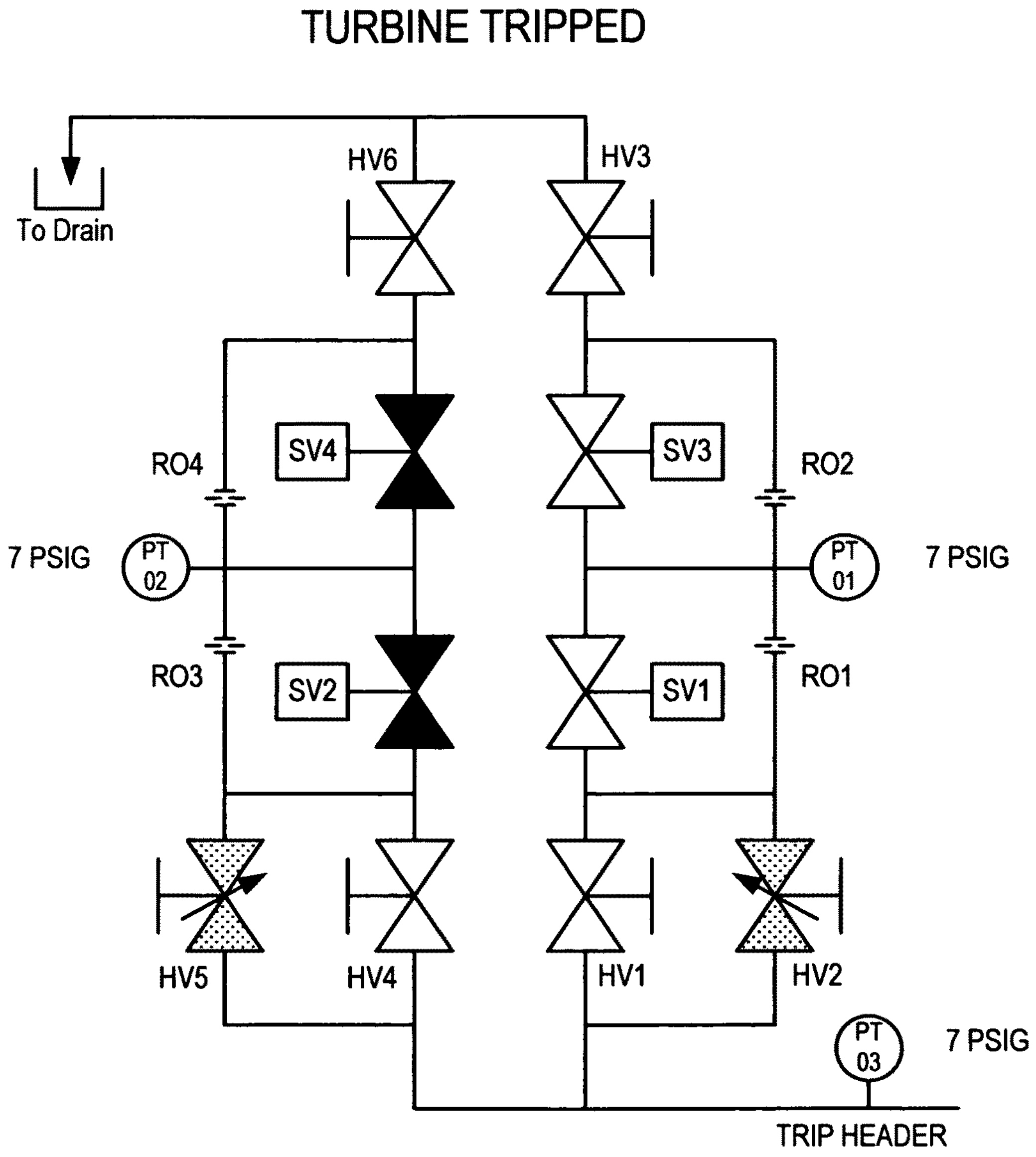

In FIG. 21, the turbine is tripped because SV1 and SV3 are both open, leaving a clear path for the lube oil in the trip header to be forced into the drain.

Figure 22:
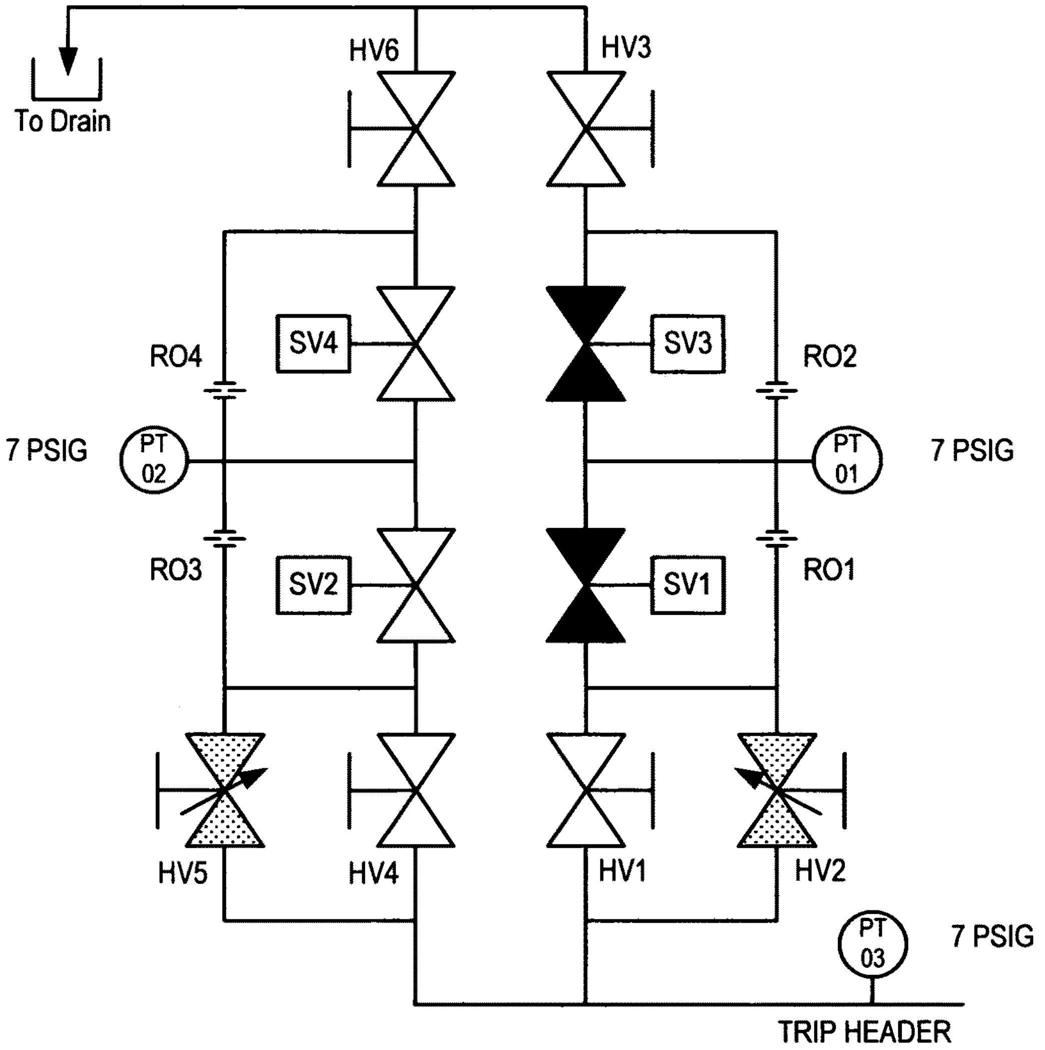

Similarly, in FIG. 22 the turbine is tripped because SV2 and SV4 are open, leaving a clear path for the lube oil to be forced into the drain.

Figure 23:
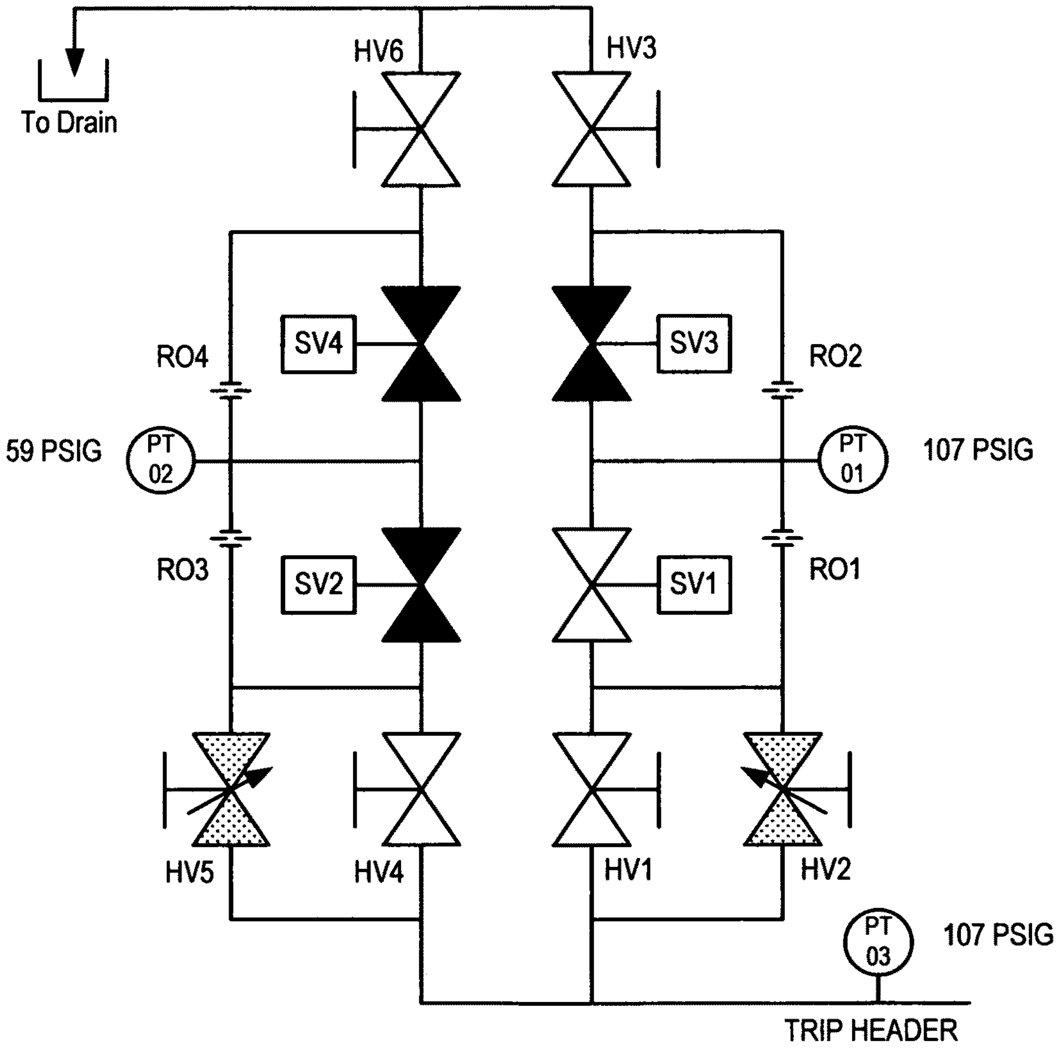

In FIG. 23, the turbine is running, again because SV3 and SV4 both being closed, there is no clear path for the lube oil to be pushed into the drain.

Figure 24:
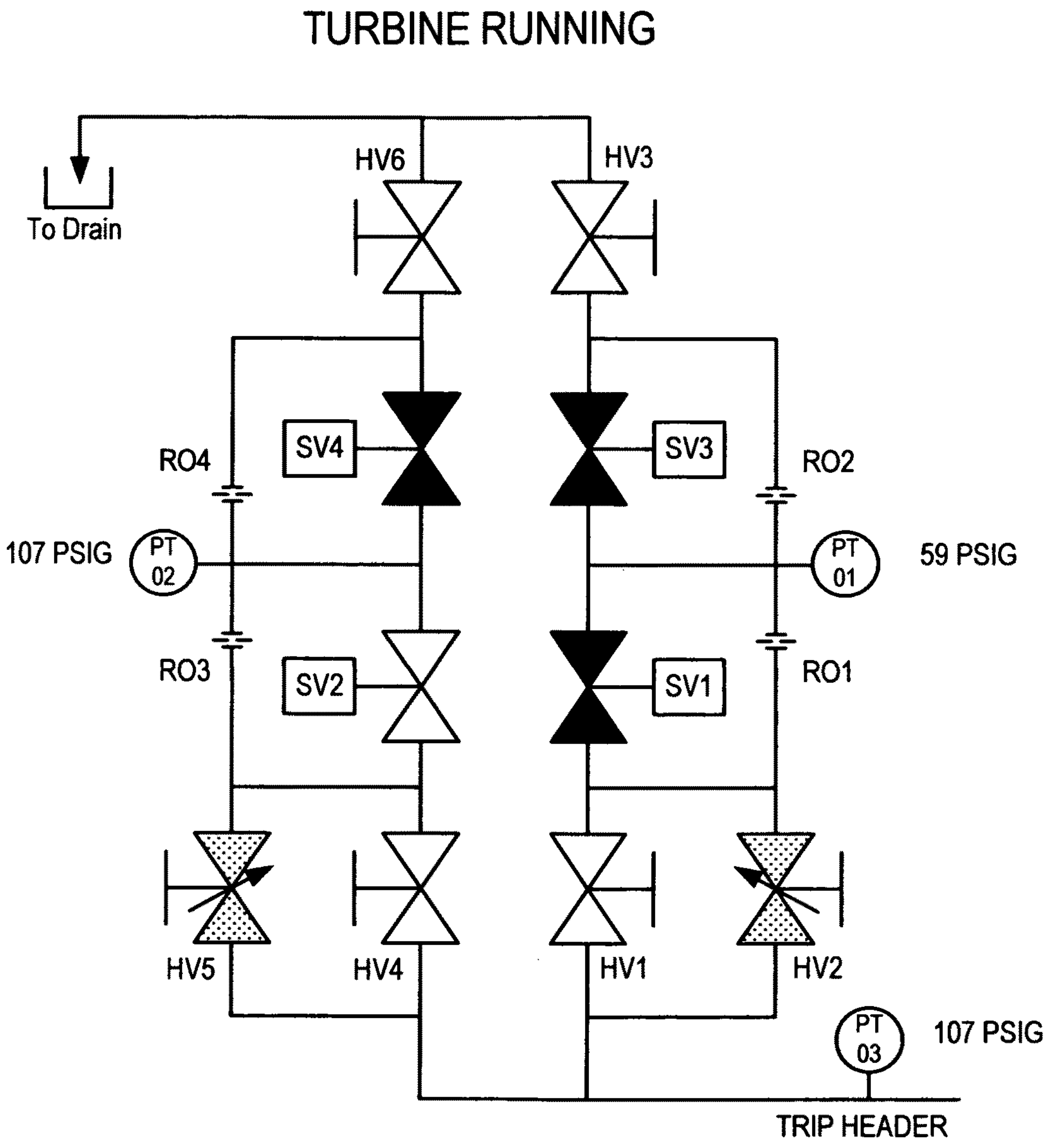

Similarly, in FIG. 24, the turbine is running because of SV3 and SV4 both being closed; there is no clear path for the lube oil to be pushed into the drain.

Figure 25:
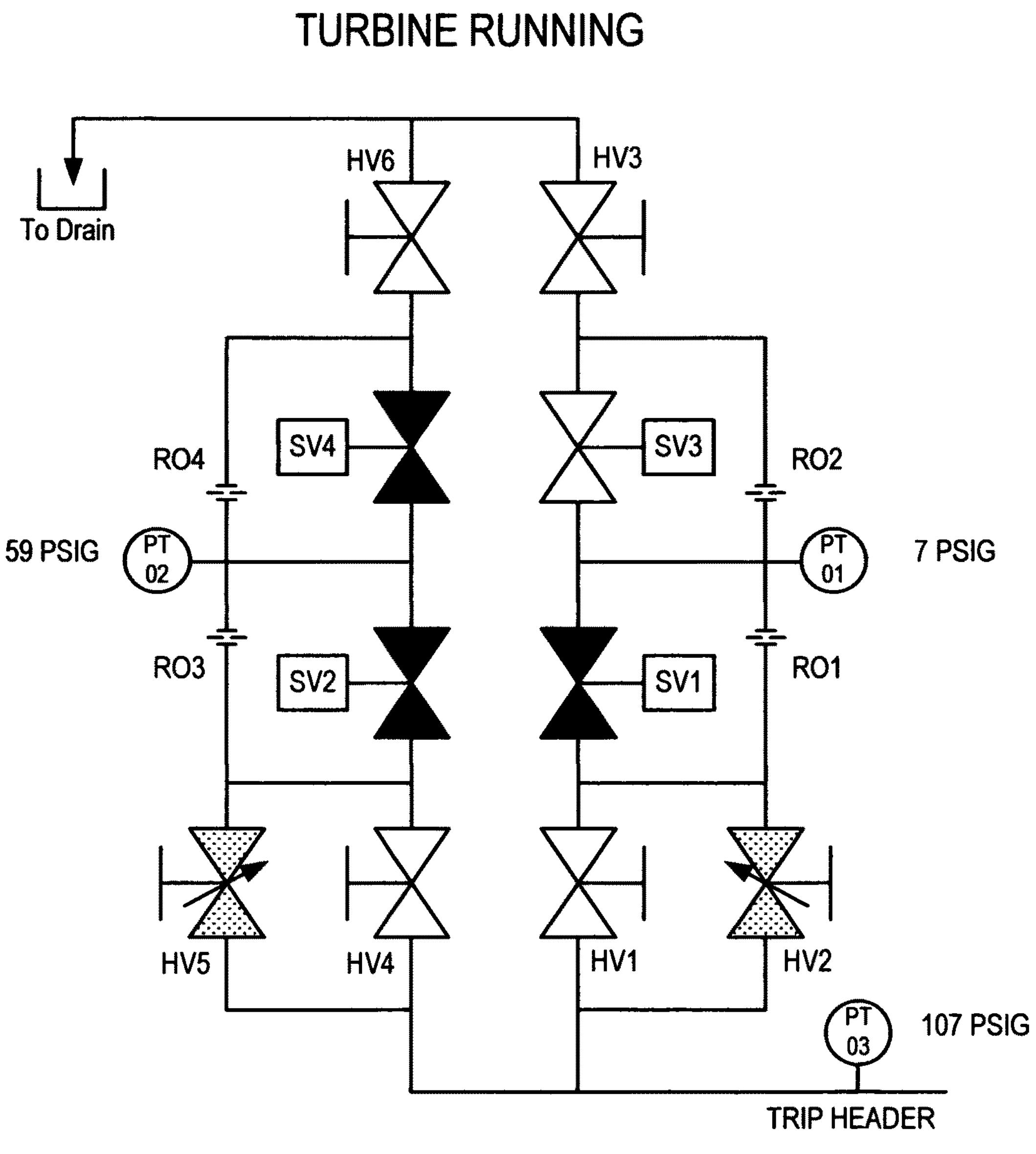

In FIG. 25, the turbine is running because the valves SV1 and SV2 are both closed.

Figure 26:
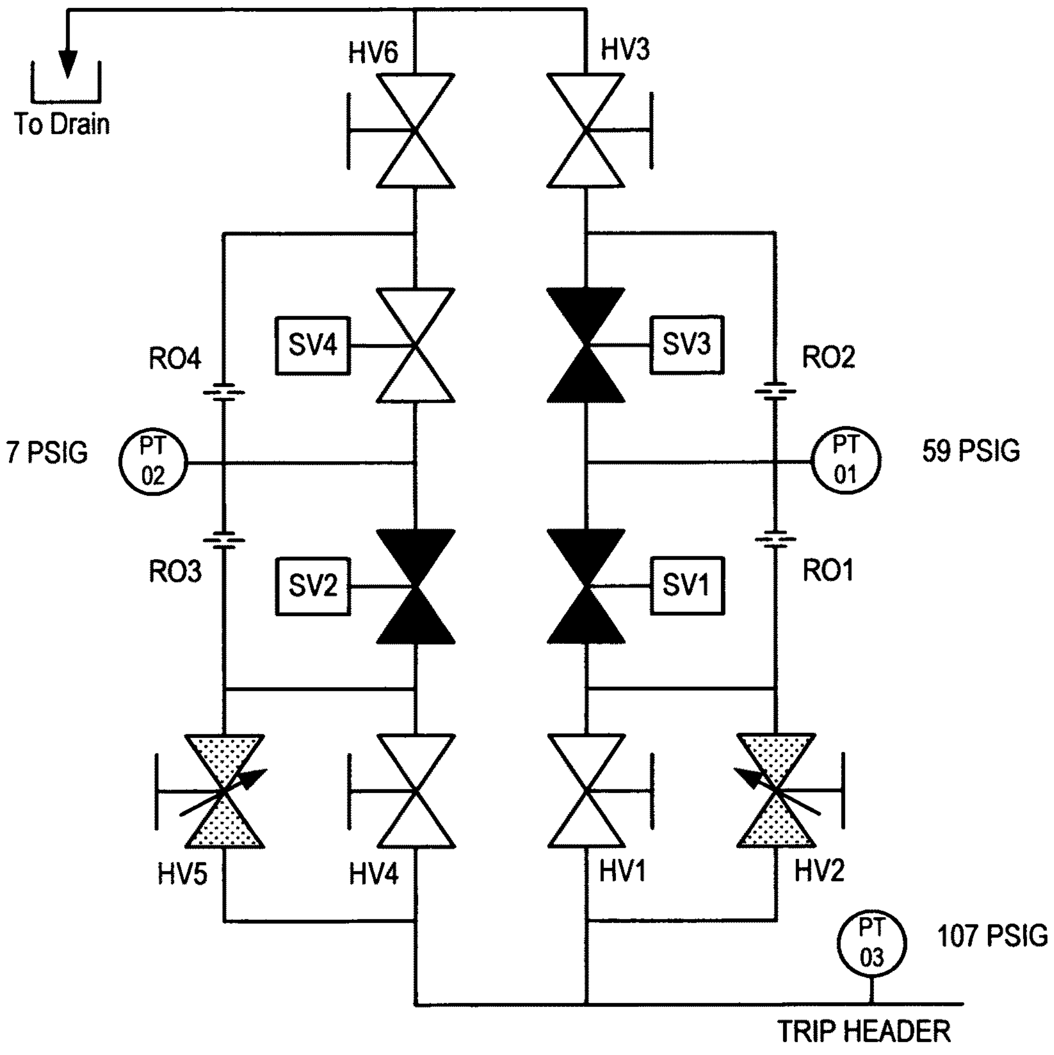

Similarly, in FIG. 26, the turbine is running because the valves SV1 and SV2 are both closed.

Figure 27:
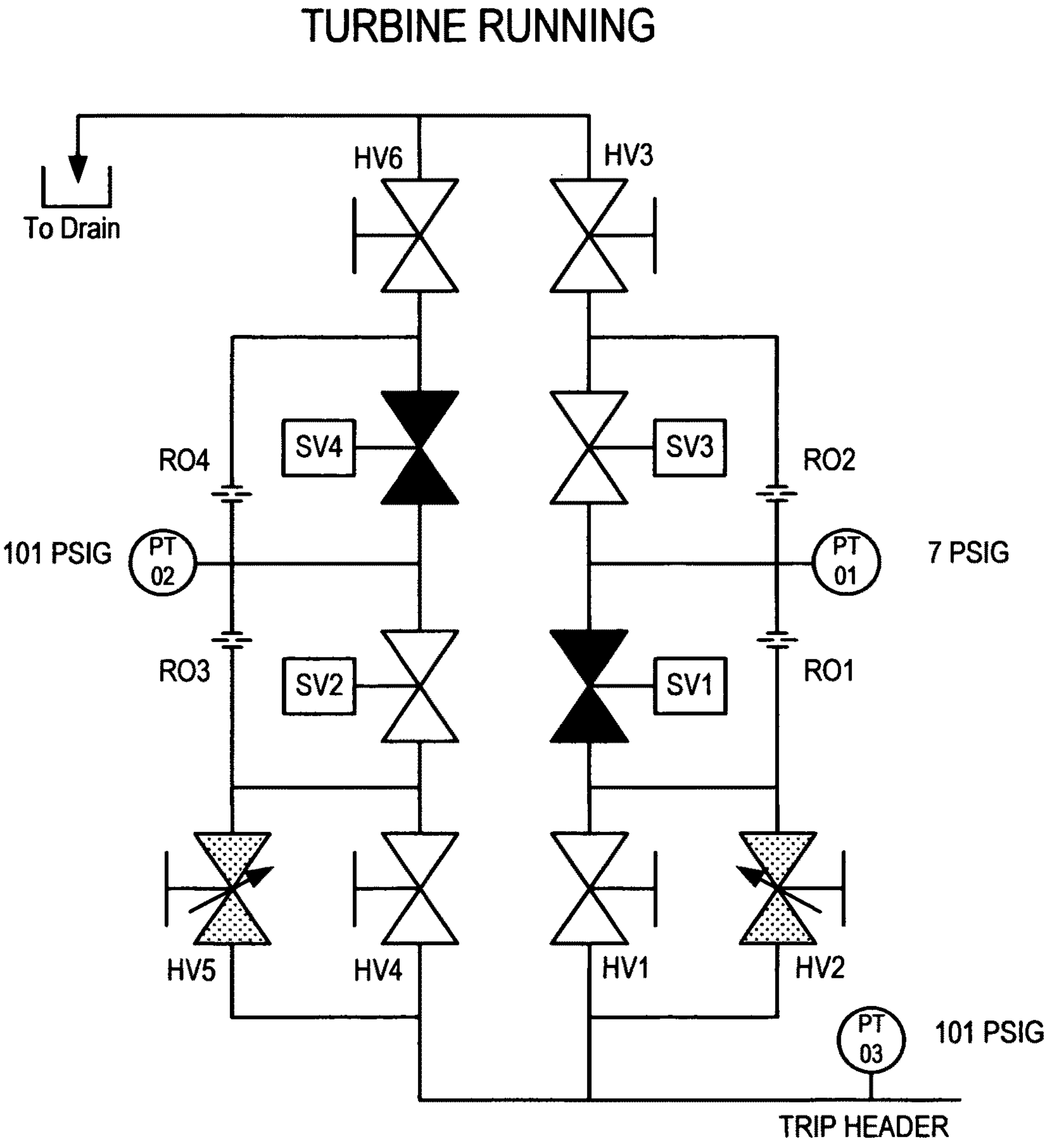

In FIG. 27, the turbine continues to run because SV1 and SV4 are blocked, leaving no clear path for the lube oil to be forced into the drain.

Figure 28:
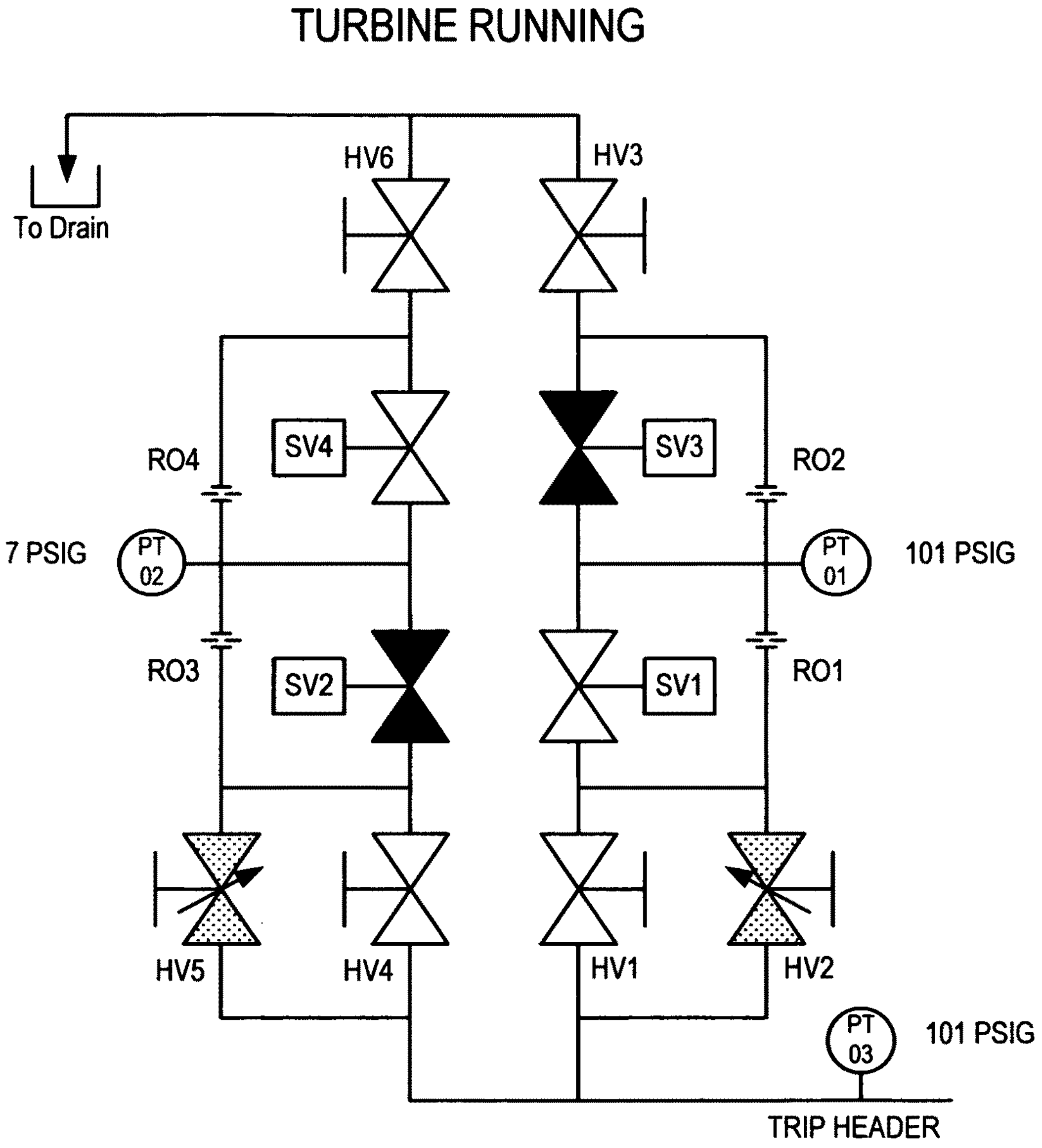

In FIG. 28, the turbine continues to run because SV2 and SV3 are both blocked, there is no clear path for the lube oil to be pushed into the drain.

Figure 29:
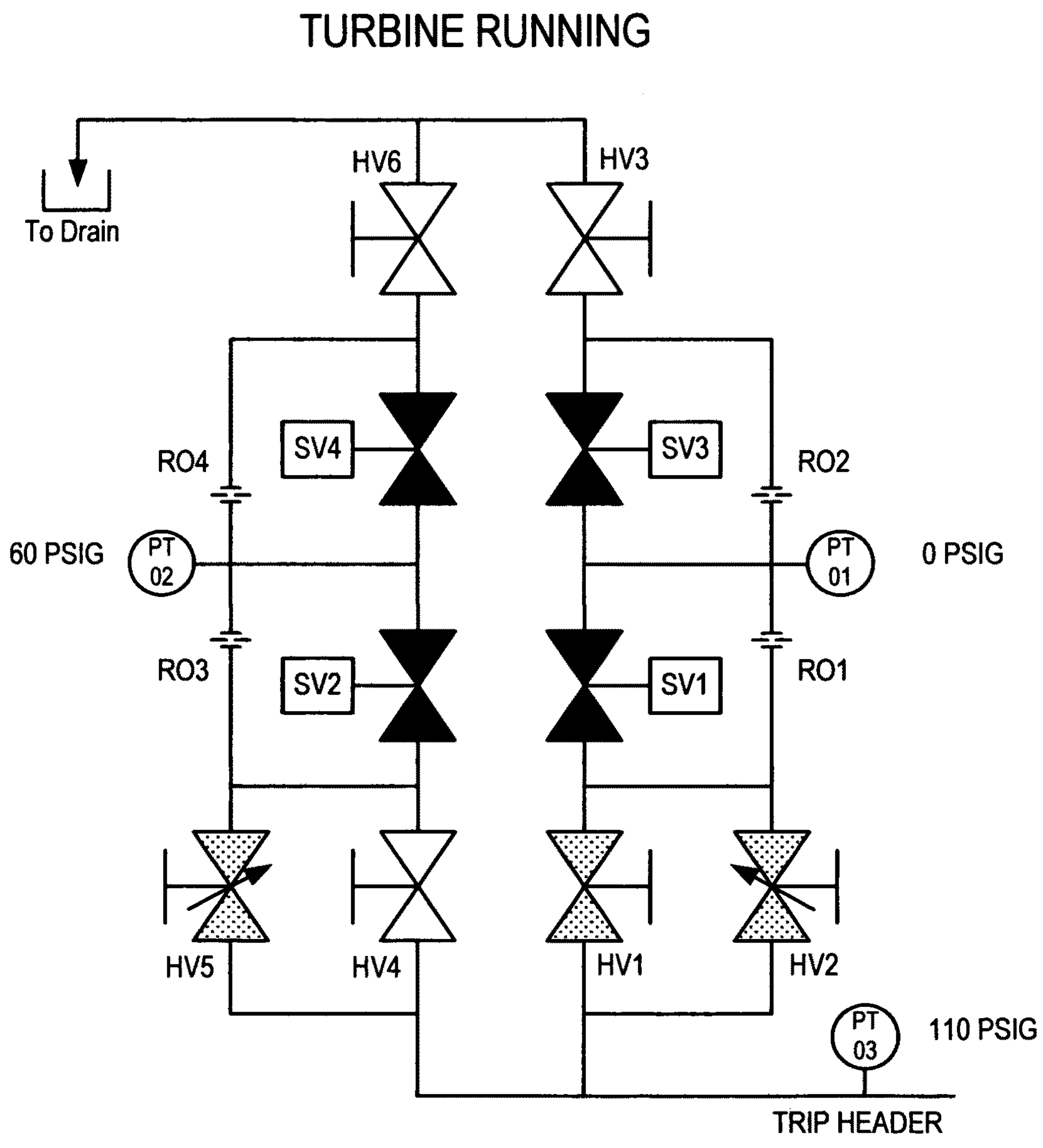

In FIG. 29, the turbine continues to run, because the respective paths of SV2 and SV4, and SV1 and SV3 are not affected other than for the pressure measured by PT01 being reduced.

Figure 30:
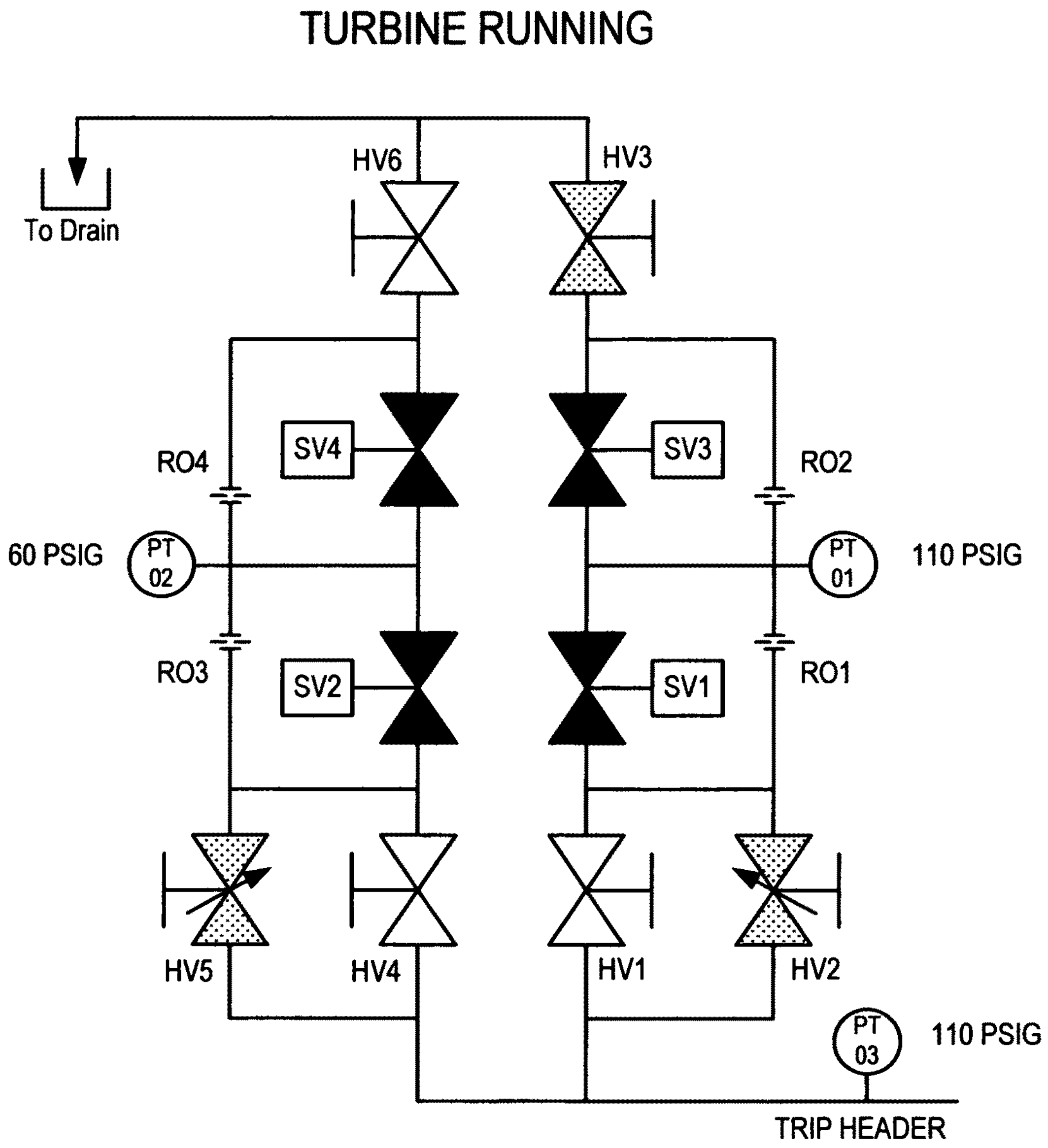

In FIG. 30, the turbine continues to run because the manual closure of the stippled pattern valve at the exit of SV3 only affects the pressure measured by PT01.

Figure 31:
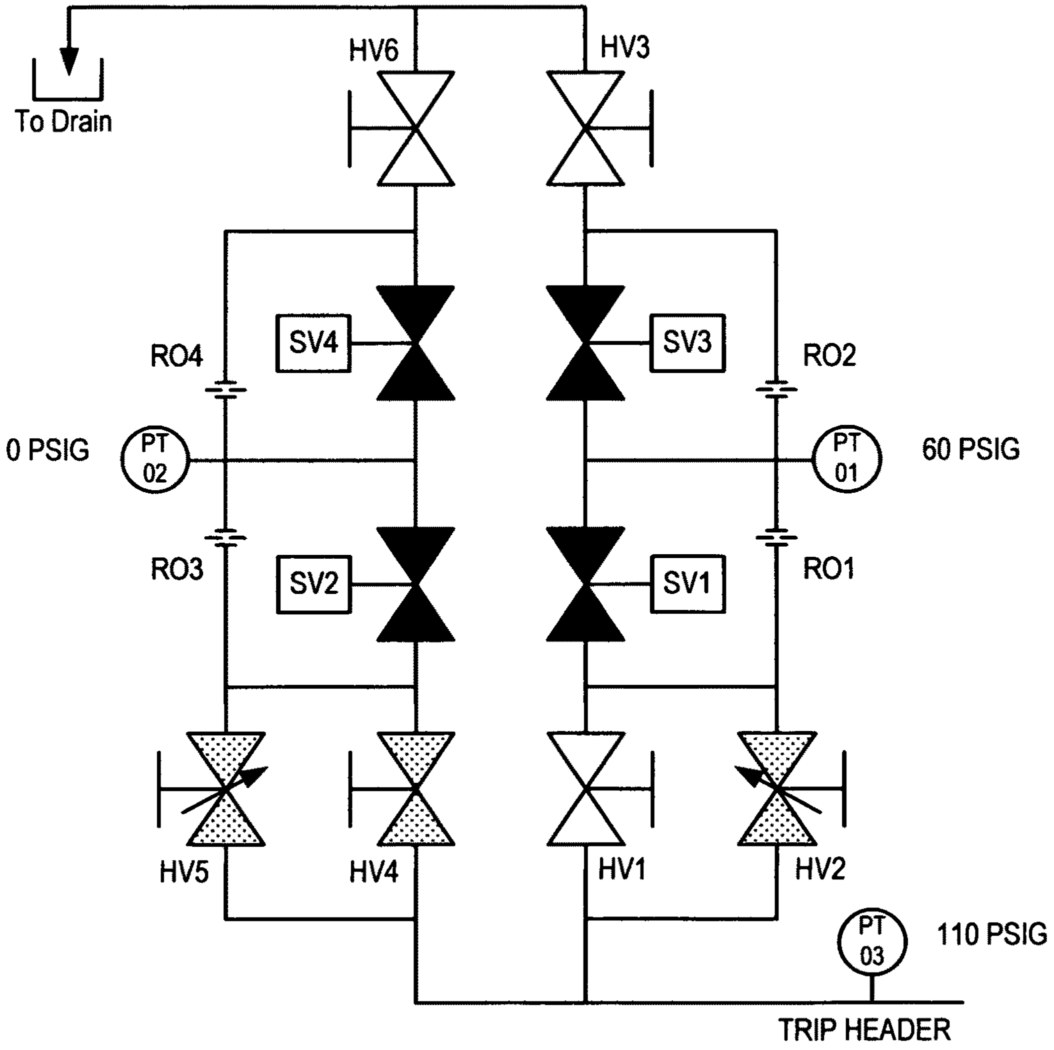

In FIG. 31, the turbine continues to run, because the manual closure of the stippled pattern valve at the entry of SV2 only affects the pressure measured at PT02.

Figure 32:
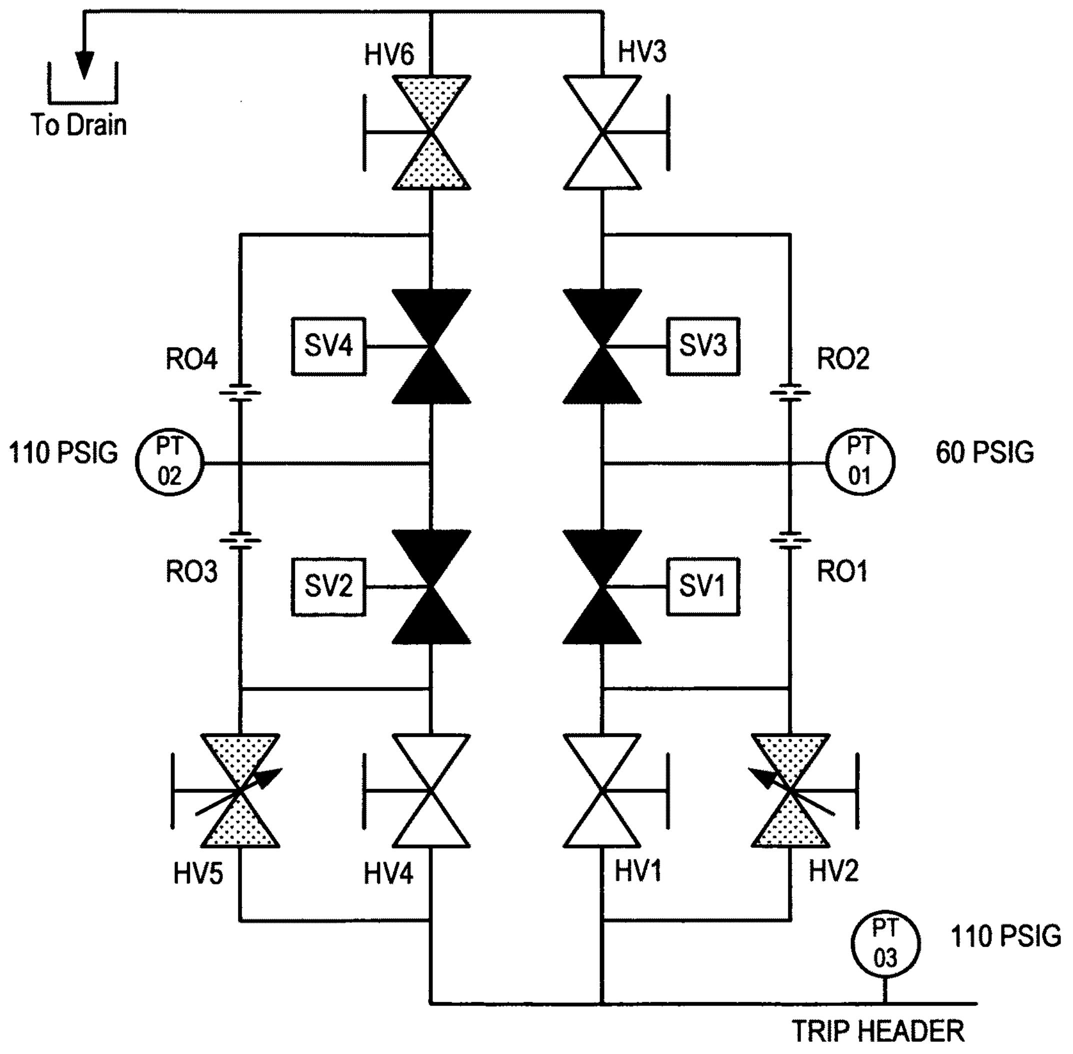

In FIG. 32, the turbine continues to run because the manual closure of the stippled pattern valve at the exit of SV4 only affects the pressure measured by PT02.

One very important feature of the present invention, involves the ability of a technician to easily troubleshoot and repair the logical array of electro-hydraulic servo valves, even while the turbine is running.

By having two (2) equal sized orifices, series (R01 and R02), while the turbine is running, the pressure measured by PT01 will be about ½ of the trip header pressure e.q., 60 PSIG compare to trip header pressure of 110 PSIG to 120 PSIG. (See FIG. 14) This is somewhat analogous to placing a pair of equally sized resistors across a voltage source to fabricate a voltage divider.

Thus, the two orifices R01 and R02, in conjunction with the use of the pressure transducer PT01, provided a valuable system for diagnosis of whether the solenoid valves SV1 and SV3 are defective. If desired, the orifices R01 and R02 may be different sizes, e.q., one being ⅛" and the other being 1/16", so long as the technician knows the relative sizes. The orifices R03 and R04, in conjunction with the pressure transducer PT02, provide similar diagnostics for the solenoids SV2 and SV4.

By monitoring the pressure transducers PT01, PT02 and PT03, the technician can know almost immediately which of the solenoid valves has failed or is about to fail. Once this is known, one or more of the manually operable solenoid valves HV1, HV2, HV3, HV4, HV5, and HV6 can be closed to isolate the one or more solenoid valves. Each of the solenoid valves, as well as each of the manual valves HV1, HV2, HV3, HV5, and HV6 valves, has four (4) mounting bolts which allows such problematic solenoid valves to be removed and replaced almost in a matter of minutes, even while the turbine is running. The turbine can then be restarted as if not already running, and returned to normal operation.

The invention claimed is:

1. A system for diagnosing and repairing problems assorted with an automatic cutoff of a steam turbine, comprising a logical array of first, second, third, and fourth electro-hydraulic solenoid valves, each such valve having an input and an output to facilitate the control of hydraulic lubrication oil through such valves;

a first hydraulic line connecting between the input of the first solenoid valve and the output of the third solenoid valve;

a second hydraulic line connecting between the input of the second solenoid valve and the output of the fourth solenoid valve;

a first pressure transducer connected between output of the first solenoid valve and the input of the third solenoid valve;

a second pressure transducer connected between the output of the second solenoid valve and the input of the fourth solenoid valve, said system being characterized by said first hydraulic line having first and second orifices connected in series within said first hydraulic line, said second hydraulic line having first and second orifices connected in series within said second hydraulic line.

2. The system according to claim 1 wherein the first and second orifices in the first hydraulic line and the first and second orifices in the second hydraulic line each has the same internal diameter.

3. The system according to claim 2 wherein the internal diameter of the said orifices has an internal diameter of 1/32".

4. The system according to claim 2 wherein the output of the second valve and the output of the fourth valve are connected together, and also to a drain for the hydraulic fluid.

5. The system according to claim 4 wherein the inputs of the first and second valve are connected together, and to the supply of the hydraulic fluid to the system.

* * * * *